US012787284B2

(12) United States Patent
Lee

(10) Patent No.: US 12,787,284 B2
(45) Date of Patent: Nov. 3, 2026

(54) SEMICONDUCTOR DEVICE AND MANUFACTURING METHOD OF SEMICONDUCTOR DEVICE

(71) Applicant: SK hynix Inc., Gyeonggi-do (KR)

(72) Inventor: Nam Jae Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 404 days.

(21) Appl. No.: 18/471,296

(22) Filed: Sep. 21, 2023

(65) Prior Publication Data

US 2025/0031372 A1 Jan. 23, 2025

(30) Foreign Application Priority Data

Jul. 20, 2023 (KR) ........................ 10-2023-0094449

(51) Int. Cl.
*H10B 43/27* (2023.01)
*H10B 41/27* (2023.01)

(52) U.S. Cl.
CPC ............ *H10B 43/27* (2023.02); *H10B 41/27* (2023.02)

(58) Field of Classification Search
CPC ................................ H10B 43/27; H10B 41/27
See application file for complete search history.

(56) References Cited

U.S. PATENT DOCUMENTS

| | | | | |
|---|---|---|---|---|
| 11,289,429 | B2 | 3/2022 | Shimamoto | |
| 2019/0043880 | A1* | 2/2019 | Lee | H10B 43/10 |
| 2021/0005629 | A1* | 1/2021 | Lim | H10B 41/10 |
| 2021/0118902 | A1* | 4/2021 | Kanamori | H10B 43/27 |
| 2021/0313281 | A1* | 10/2021 | Kaminaga | H10W 42/00 |

FOREIGN PATENT DOCUMENTS

KR 10-2021-0002773 A 1/2021

* cited by examiner

*Primary Examiner* — Christine A Enad
(74) *Attorney, Agent, or Firm* — IP&T GROUP LLP

(57) ABSTRACT

A semiconductor device may include a gate structure including gate lines and insulating layers that are alternately stacked; a channel structure extending through the gate structure; a dummy gate structure including stacked dummy gate lines; a dummy channel structure extending through the dummy gate structure; and an isolation insulating structure including horizontal portions stacked between the gate structure and the dummy gate structure and vertical portions extending through the horizontal portions.

19 Claims, 29 Drawing Sheets

B-B'

SEMICONDUCTOR DEVICE AND MANUFACTURING METHOD OF SEMICONDUCTOR DEVICE

CROSS-REFERENCE TO RELATED APPLICATION

This application claims priority under 35 U.S.C. § 119 to Korean Patent Application No. 10-2023-0094449 filed on Jul. 20, 2023, which is incorporated herein by reference in its entirety.

BACKGROUND

1. Technical Field

Embodiments of the present disclosure relate to an electronic device, and more particularly, to a semiconductor device and a manufacturing method of the semiconductor device.

2. Related Art

The degree of integration of a semiconductor device is mainly determined by the area occupied by a unit memory cell. Recently, as the improvement in the degree of integration of a semiconductor device for forming memory cells in a single layer on a substrate reaches a limit, a three-dimensional semiconductor device for stacking memory cells on a substrate has been proposed. Furthermore, to improve the operational reliability of such a semiconductor device, various structures and manufacturing methods have been developed.

SUMMARY

In an embodiment, a semiconductor device may include: a gate structure including gate lines and insulating layers that are alternately stacked; a channel structure extending through the gate structure; a dummy gate structure including stacked dummy gate lines; a dummy channel structure extending through the dummy gate structure; and an isolation insulating structure including horizontal portions stacked between the gate structure and the dummy gate structure and vertical portions extending through the horizontal portions.

In an embodiment, a semiconductor device may include: a gate structure including stacked gate lines; a channel structure extending through the gate structure; contact plugs extending through the gate structure and connected to the gate lines, respectively; a dummy gate structure adjacent to the gate structure in a first direction and including stacked dummy gate lines; a dummy channel structure extending through the dummy gate structure; and an isolation insulating structure located between the gate structure and the dummy gate structure, extending in a second direction intersecting the first direction, and including dummy contact plugs arranged in the second direction.

In an embodiment, a manufacturing method of a semiconductor device may include: forming a first stack including first material layers and second material layers that are alternately stacked; forming dummy holes in the first stack; forming a second stack on the first stack, the second stack including third material layers and fourth material layers that are alternately stacked; forming a dummy contact hole in the second stack, the dummy contact hole being connected to the dummy holes; forming an isolation trench by etching the first material layers and the third material layers through the dummy contact hole and the dummy holes; and forming an isolation insulating structure in the isolation trench.

In an embodiment, a manufacturing method of a semiconductor device may include: forming a first stack including first material layers and second material layers that are alternately stacked; forming a dummy hole in the first stack; forming a second stack on the first stack, the second stack including third material layers and fourth material layers that are alternately stacked; forming a dummy contact hole in the second stack, the dummy contact hole being connected to the dummy hole and having a greater width than the dummy hole; forming contact holes in the second stack, the contact holes exposing the first material layers and the third material layers, respectively; forming an isolation trench by etching the first material layers and the third material layers through the dummy contact hole and the dummy hole; forming an isolation insulating structure in the isolation trench; forming a dummy contact plug in the isolation insulating structure; and forming contact plugs in the contact holes.

DETAILED DESCRIPTION

Various embodiments of the present disclosure are directed to a semiconductor device having a stable structure and improved characteristics and a manufacturing method of the semiconductor device.

By stacking memory cells in three dimensions, it is possible to improve the degree of integration of a semiconductor device. It is also possible to provide a semiconductor device having a stable structure and improved reliability.

Hereafter, embodiments in accordance with the technical spirit of the present disclosure will be described with reference to the accompanying drawings.

Figure 1A:
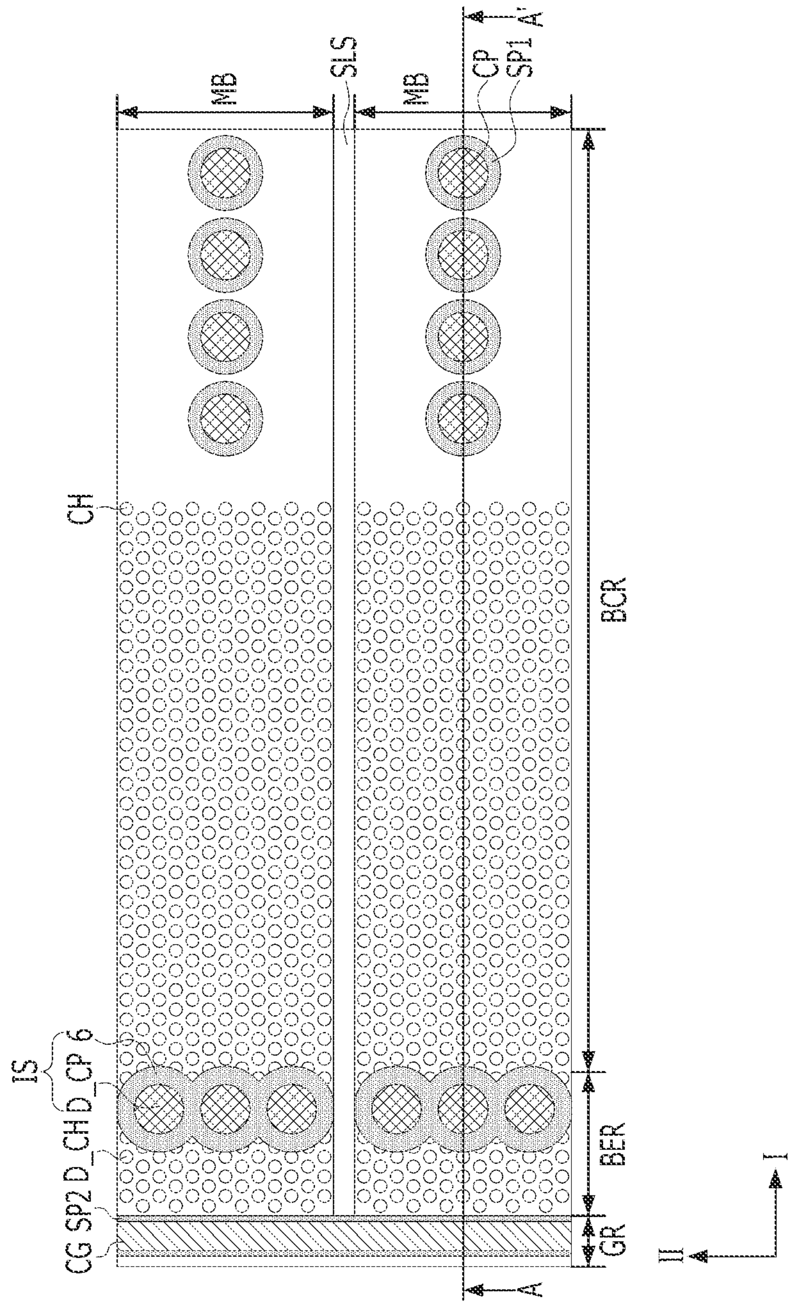
FIGS. 1A and 1B are diagrams illustrating the structure of a semiconductor device in accordance with an embodiment of the present disclosure.
Figure 1B:
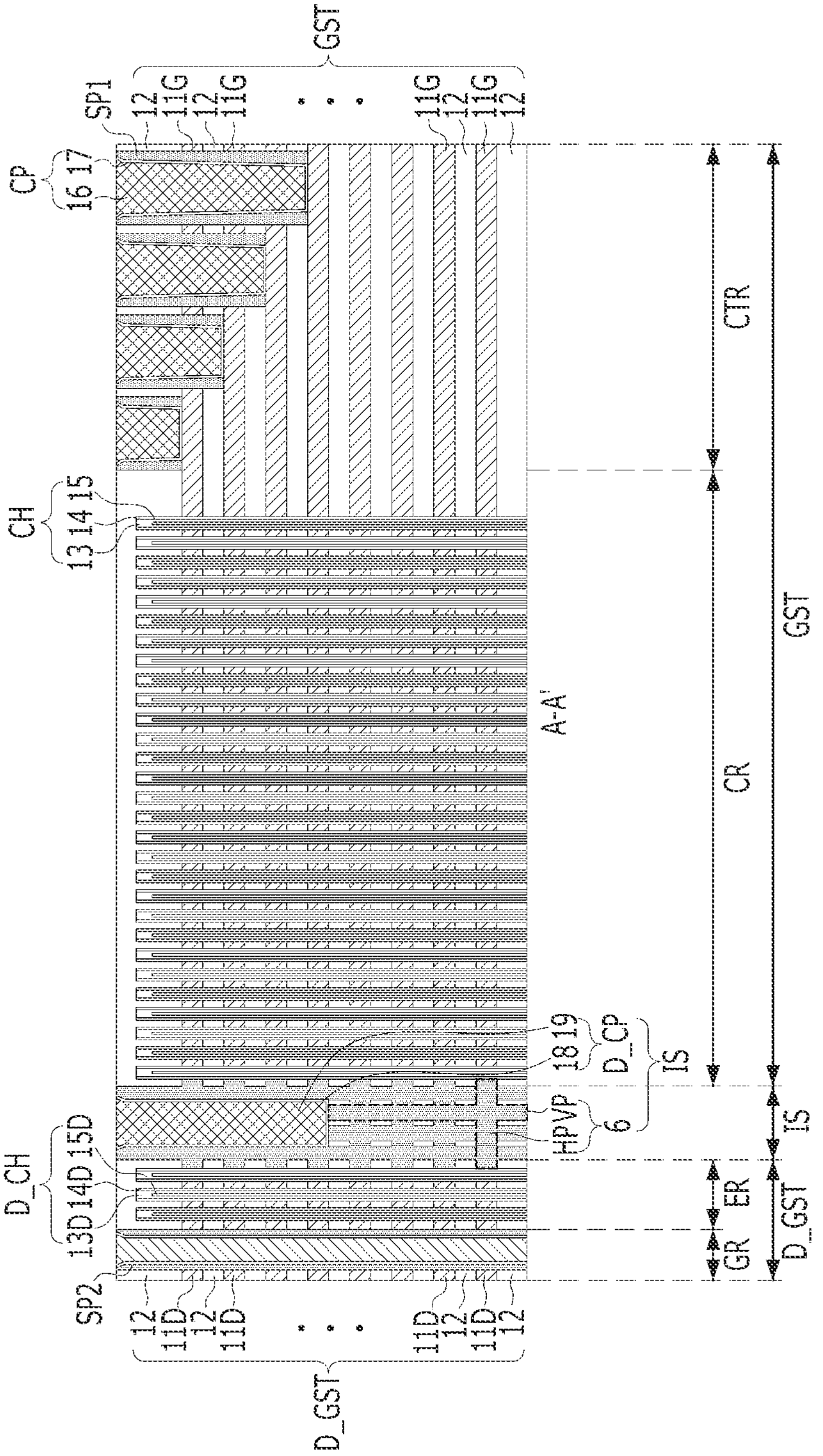

FIGS. 1A and 1B are diagrams illustrating the structure of a semiconductor device in accordance with an embodiment of the present disclosure. FIG. 1A is a plan view, and FIG. 1B is a cross-sectional view taken along line A-A' of FIG. 1A.

Referring to FIGS. 1A and 1B, the semiconductor device may include a gate structure GST, a channel structure CH, a dummy gate structure D_GST, a dummy channel structure D_CH, and an isolation insulating structure IS. The semiconductor device may further include at least one of a slit structure SLS, a contact plug CP, a chip guard structure CG, a first insulating spacer SP1, and a second insulating spacer SP2.

The semiconductor device may be a chip, and may include a guard region GR defined at an edge of the chip. A plurality of planes may be located in the guard region GR. Each plane may include a plurality of memory blocks MB. Each memory block MB may include a block center region BCR and a block edge region BER. The block edge region BER may be located between the block center region BCR and the guard region GR. The gate structure GST may be located in the block center region BCR, and the dummy gate structure D_GST may be located in the block edge region BER and guard region GR.

The gate structure GST may include gate lines 11G and insulating layers 12 that are alternately stacked. The gate lines 11G may be word lines, source select lines, drain select lines, and the like. The gate lines 11G may each include a conductive material such as, for example, polysilicon or metal. The insulating layers 12 insulate the stacked gate lines 11G from each other. The insulating layers 12 may each include an insulating material such as, for example, an oxide, or a nitride. In some embodiments, the insulating layers 12 may each include a gap.

The gate structure GST may include a cell region CR and a contact region CTR as illustrated in FIG. 1B. The cell region CR may be a region where memory cells are located. The contact region CTR may be a region where an interconnection structure such a contact plug and a line are located. The interconnection structure may provide a path for transmitting a bias for driving the stacked memory cells.

The channel structure CH may extend through the gate structure GST. The channel structure CH may be located in the cell region CR of the gate structure GST. The channel structure CH may include at least one of a channel layer 13, a memory layer 14, and an insulating core 15. The memory layer 14 may include a floating gate, polysilicon, a charge trap material, nitride, a variable resistance material, or the like. For reference, some of the channel structures CH penetrating through the gate structure GST may be dummy channel structures. According to an example, channel structures CH located adjacent to the contact region CTR among the channel structures CH may be dummy channel structures. Channel structures CH located adjacent to the dummy gate structure D_GST among the channel structures CH may be dummy channel structures.

The contact plug CP may extend through the gate structure GST, and may be electrically connected to the gate lines 11G. The contact plug CP may be located in the contact region CTR of the gate structure GST. The contact plug CP may include a conductive plug 16 and a barrier layer 17 surrounding the conductive plug 16. The conductive plug 16 may include a metal such as, for example, tungsten or molybdenum. The barrier layer 17 may include a metal nitride such as, for example, a titanium nitride. The first insulating spacer SP1 may surround the sidewalls of the contact plug CP. The first insulating spacer SP1 may include an insulating material such as, for example, an oxide or a nitride.

The dummy gate structure D_GST may include stacked dummy gate lines 11D. The dummy gate lines 11D may be located at levels corresponding to the gate lines 11G. The insulating layers 12 may extend between the dummy gate lines 11D, and the dummy gate lines 11D and the insulating layers 12 may be alternately stacked. The dummy gate lines 11D may each include a conductive material such as, for example, polysilicon or metal. The gate structure GST and the dummy gate structure D_GST may be adjacent to each other in a first direction I.

The dummy gate structure D_GST may include a guard region GR and an edge region ER. The edge region ER may be located between the guard region GR and the cell region CR. The dummy channel structure D_CH may be located in the edge region ER. The chip guard structure CG may be located in the guard region GR.

At least a portion of the dummy gate structure D_GST may include sacrificial layers instead of the dummy gate lines 11D. For example, the sacrificial layers may be layers remaining without being replaced by the dummy gate lines 11D in a manufacturing process. According to an example, the sacrificial layers and the insulating layers 12 may be alternately stacked in the guard region GR.

The dummy channel structure D_CH may extend through the edge region ER of the dummy gate structure D_GST. The dummy channel structure D_CH may have a structure similar to that of the channel structure CH. The dummy channel structure D_CH may include at least one of a dummy channel layer 13D, a dummy memory layer 14D, and a dummy insulating core 15D. The dummy memory layer 14D may include a floating gate, polysilicon, a charge trap material, nitride, a variable resistance material, or the like.

The chip guard structure CG may be located at the edge of the chip. The chip guard structure CG may extend through the guard region GR of the dummy gate structure D_GST. The chip guard structure CG may include a conductive material such as, for example, polysilicon or metal. The second insulating spacer SP2 may surround sidewalls of the chip guard structure CG.

The isolation insulating structure IS may be located between the gate structure GST and the dummy gate structure D_GST. The isolation insulating structure IS may extend in a second direction II intersecting the first direction I, and may electrically isolate the gate structure GST and the dummy gate structure D_GST from each other. A plurality of isolation insulating structures IS may be arranged along the second direction II, and may be isolated from each other.

The isolation insulating structure IS may include an isolation layer 6. The isolation layer 6 may include horizontal portions HP and vertical portions VP. The horizontal portions HP may be stacked between the gate structure GST and the dummy gate structure D_GST. The horizontal portions HP may be located to correspond to the gate lines 11G and the dummy gate lines 11D, and may be located between the gate lines 11G and the dummy gate lines 11D. The insulating layers 12 may extend between the horizontal portions HP, and the horizontal portions HP and the insulating layers 12 may be alternately stacked. The vertical portions VP may extend through the horizontal portions HP. The isolation layer 6 may include an insulating material such as, for example, an oxide or a nitride.

The isolation insulating structure IS may include at least one dummy contact plug D_CP. The dummy contact plug D_CP may be located inside the isolation layer 6, and the isolation layer 6 may surround the dummy contact plug D_CP. The dummy contact plugs D_CP may be arranged in the second direction II, and the isolation layers 6 may extend in the second direction II while surrounding sidewalls of the dummy contact plugs D_CP.

The dummy contact plug D_CP may have a structure similar to that of the contact plug CP. The dummy contact plug D_CP may include a conductive plug 18 and a barrier layer 19 surrounding the conductive plug 18. The conductive plug 18 may include a metal such as, for example, tungsten or molybdenum. The barrier layer 19 may include a metal nitride such as, for example, a titanium nitride. The dummy contact plug D_CP may be located on the horizontal portions HP. The vertical portions VP may extend along sidewalls of the dummy contact plug D_CP.

The slit structure SLS may be located between the gate structures GST. The slit structure SLS may be located between memory blocks MB adjacent to each other in the second direction II, and the memory blocks MB adjacent to each other may be electrically isolated from each other by the slit structure SLS. The slit structure SLS may extend from the block center region BCR to the block edge region BER. It is also possible that the slit structure SLS extends to the guard region GR. The slit structure SLS may be formed in a slit in a manufacturing process, and the slit may be used as a passage for replacing sacrificial layers with the gate lines 11G or the dummy gate lines 11D. The slit structure SLS may extend along the first direction I, and may insulate gate structures GST adjacent to each other in the second direction II from each other. The slit structure SLS may extend between the isolation insulating structures IS and between the dummy gate structures D_GST.

The slit structure SLS may include at least one of an insulating material, a conductive material, and a semiconductor material. According to an example, the slit structure SLS may include an insulating material such as, for example, an oxide or a nitride. The slit structure SLS may include a semiconductor material such as, for example, a silicon or a germanium. In an embodiment, the slit structure SLS may include a source contact structure therein, and the source contact structure may be electrically connected to a source line.

According to the structure described above, a pattern density at which the dummy channel structures D_CH are disposed in the edge region ER and a pattern density at which the channel structures CH are disposed in the cell region CR may be substantially the same as or similar to each other. Accordingly, it is possible to reduce bending of a stack, a slit, and the like, in a region having a relatively low pattern density in the manufacturing process. A shape of the slit structure SLS may not be changed to compensate for a pattern density difference, and the slit structure SLS may have a uniform width. In addition, by locating the gate structure GST in the block center region BCR and the dummy gate structure D_GST in the block edge region BER, it is possible to reduce the occurrence of wafer warpage. Wafer warpage refers to the deformation or distortion of the wafer.

FIGS. 2A, 3A, 4A, 5A, and 6A and FIGS. 2B, 3B, 4B, 5B, and 6B are diagrams for describing a manufacturing method of a semiconductor device in accordance with an embodiment of the present disclosure. Hereinafter, the content overlapping with the previously described content may be omitted.

Figure 2A:
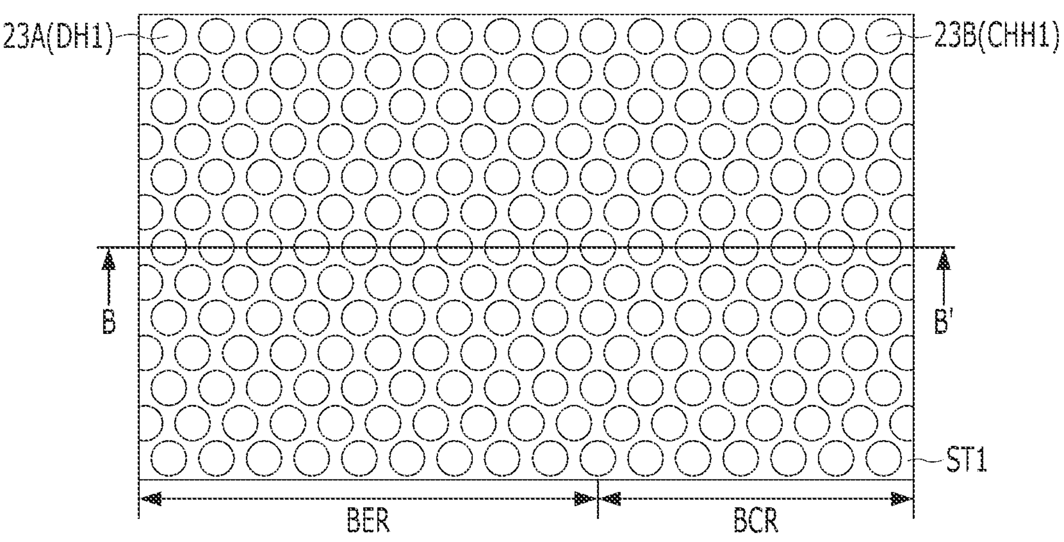
FIGS. 2A, 3A, 4A, 5A, and 6A and FIGS. 2B, 3B, 4B, 5B, and 6B are diagrams for describing a manufacturing method of a semiconductor device in accordance with an embodiment of the present disclosure.
Figure 2B:
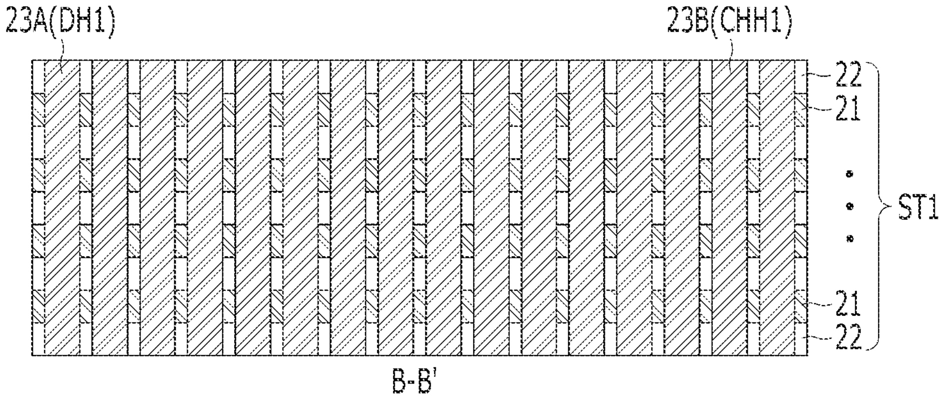

Referring to FIGS. 2A and 2B, a first stack ST1 including first material layers 21 and second material layers 22 that are alternately stacked may be formed. According to an example, the first stack ST1 may be formed in a block center region BCR and a block edge region BER of a memory block. The first material layers 21 may be used to form gate lines. The first material layers 21 may each include a sacrificial material such as nitride or a conductive material such as, for example, polysilicon or metal. The second material layers 22 may each include an insulating material such as, for example, an oxide or a nitride.

Subsequently, first dummy holes DH1 may be formed in the first stack ST1. The first dummy holes DH1 may be located in the block edge region BER. First channel holes CHH1 may be formed in the first stack ST1. The first channel holes CHH1 may be located in the block center region BCR. When the first dummy holes DH1 are formed, the first channel holes CHH1 may be formed. The first dummy holes DH1 and the first channel holes CHH1 may be formed at the same time. The first dummy holes DH1 and the first channel holes CHH1 may be formed with a uniform pattern density in the block edge region BER and the block center region BCR, respectively.

Subsequently, first sacrificial layers 23A may be formed in the first dummy holes DH1. The first sacrificial layers 23A may each include a material having a high etching selectivity with respect to the first material layers 21 and the second material layers 22. First sacrificial layers 23B may be formed in the first channel holes CHH1. The first sacrificial layers 23B may each include a material having a high etching selectivity with respect to the first material layers 21 and the second material layers 22. When the first sacrificial layers 23A are formed, the first sacrificial layers 23B may be formed.

Figure 3A:
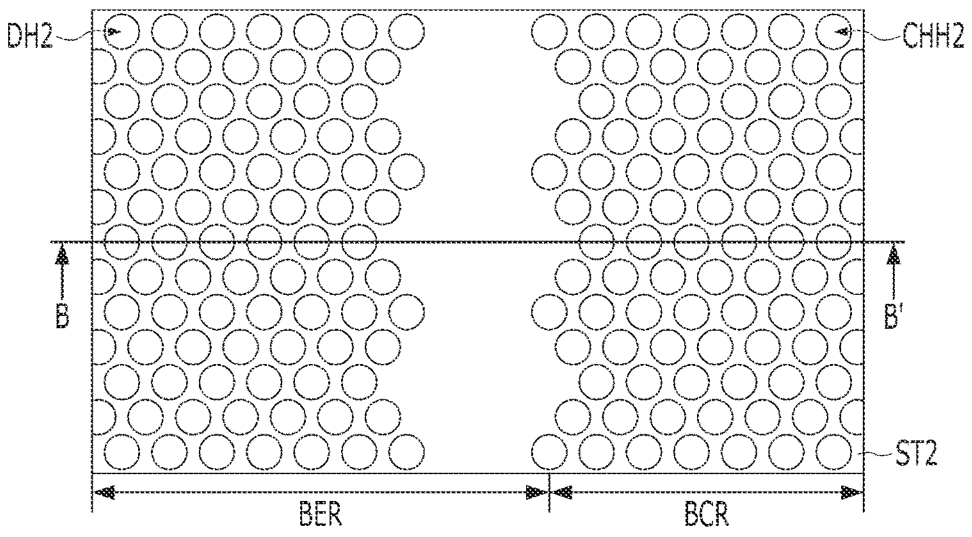
Figure 3B:
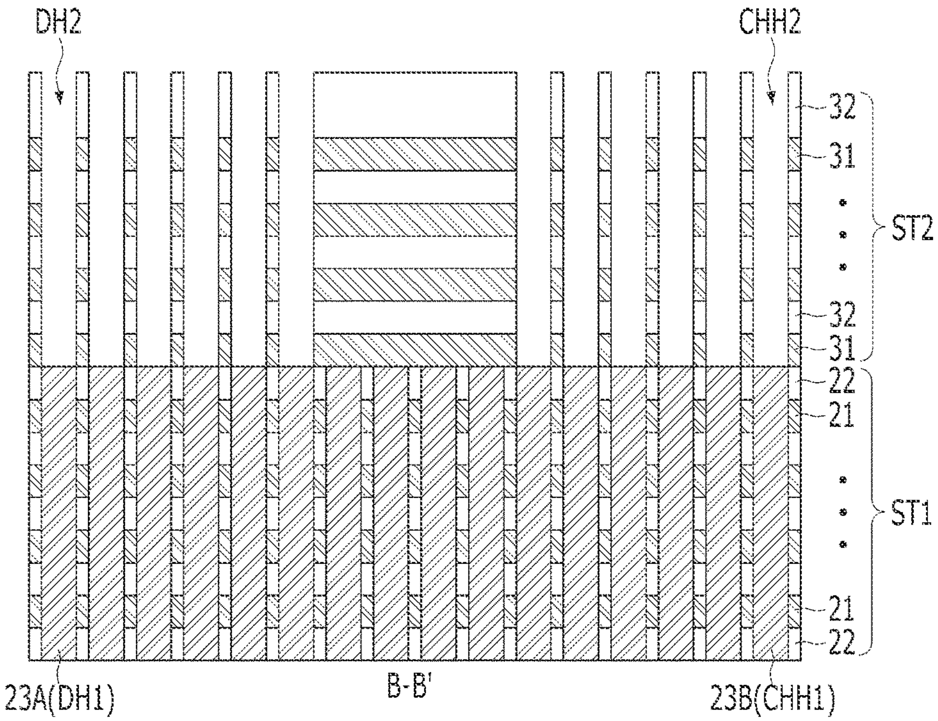

Referring to FIGS. 3A and 3B, a second stack ST2 may be formed on the first stack ST1. The second stack ST2 may include third material layers 31 and fourth material layers 32 that are alternately stacked. According to an example, the second stack ST2 may be formed in the block center region BCR and the block edge region BER of the memory block. The third material layers 31 may be used to form gate lines. The third material layers 31 may each include a sacrificial material such as nitride or a conductive material such as, for example, polysilicon or metal. The fourth material layers 32 may each include an insulating material such as, for example, an oxide or a nitride.

Subsequently, second dummy holes DH2 may be formed in the second stack ST2. The second dummy holes DH2 may be located in the block edge region BER, and may be connected to the first dummy holes DH1. The number of second dummy holes DH2 may be the same as or different from the number of first dummy holes DH1. According to an example, the number of second dummy holes DH2 may be smaller than the number of first dummy holes DH1, and some of the first dummy holes DH1 may not be connected to the second dummy holes DH2. The second dummy holes DH2 may not be formed in a region where a dummy contact hole is to be formed in a subsequent process. The second dummy holes DH2 may not be formed in a portion of the block edge region BER adjacent to the block center region BCR.

Second channel holes CHH2 may be formed in the second stack ST2. The second channel holes CHH2 may be located in the block center region BCR, and may be connected to the first channel holes CHH1. When the second dummy holes DH2 are formed, the second channel holes CHH2 may be formed.

Figure 4A:
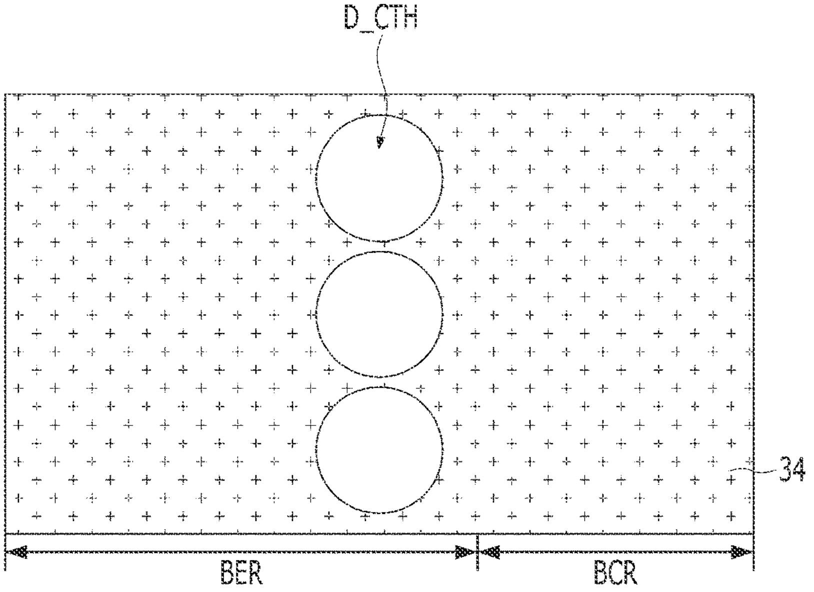
Figure 4B:
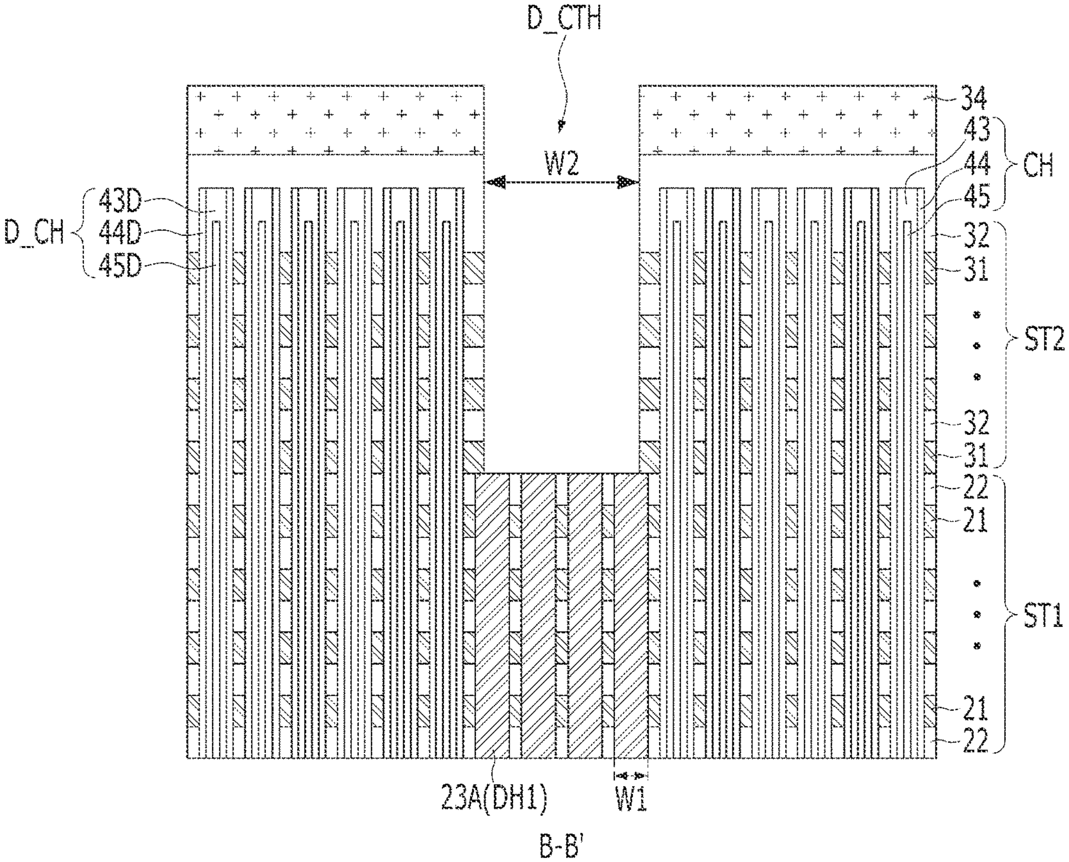

Referring to FIGS. 4A and 4B, the first sacrificial layers 23A may be removed through the second dummy holes DH2. Through this, the first dummy holes DH1 may be reopened. The first sacrificial layers 23B may be removed through the second channel holes CHH2. Through this, the first channel holes CHH1 may be reopened.

Subsequently, channel structures CH may be formed. According to an example, the channel structures CH may be formed in the first channel holes CHH1 and the second channel holes CHH2 connected to each other. The channel structure CH may include at least one of a channel layer 43, a memory layer 44, and an insulating core 45. Dummy channel structures D_CH may be formed. According to an example, the dummy channel structures D_CH may be formed in the first dummy holes DH1 and the second dummy holes DH2 connected to each other. The dummy channel structure D_CH may include at least one of a dummy channel layer 43D, a dummy memory layer 44D, and a dummy insulating core 45D. When the channel structures CH are formed, the dummy channel structures D_CH may be formed. Because the second dummy holes DH2 are not formed in a region where a dummy contact hole D_CTH is to be formed in a subsequent process, the first sacrificial layers 23A may remain in the first dummy holes DH1 of the corresponding region. The dummy channel structures D_CH may not be formed in the corresponding region. Subsequently, the fourth material layer 32 may be additionally formed to cover the channel structures CH.

Subsequently, the dummy contact hole D_CTH may be formed in the second stack ST2. According to an example, a mask pattern 34 may be formed on the second stack ST2, and the dummy contact hole D_CTH may be formed by etching the second stack ST2 using the mask pattern 34 as an etching barrier.

In a plan view, the dummy contact hole D_CTH may have a greater size than the first dummy hole DH1. According to an example, the first dummy hole DH1 may have a first width W1, and the dummy contact hole D_CTH may have a second width W2 that is greater than the first width W1. The dummy contact hole D_CTH may be connected to a plurality of first dummy holes DH1. The dummy contact hole D_CTH may be located in the block edge region BER, and may be located between the dummy channel structures D_CH and the channel structures CH. The first dummy holes DH1 and the first sacrificial layers 23A may be exposed through the dummy contact hole D_CTH.

Figure 5A:
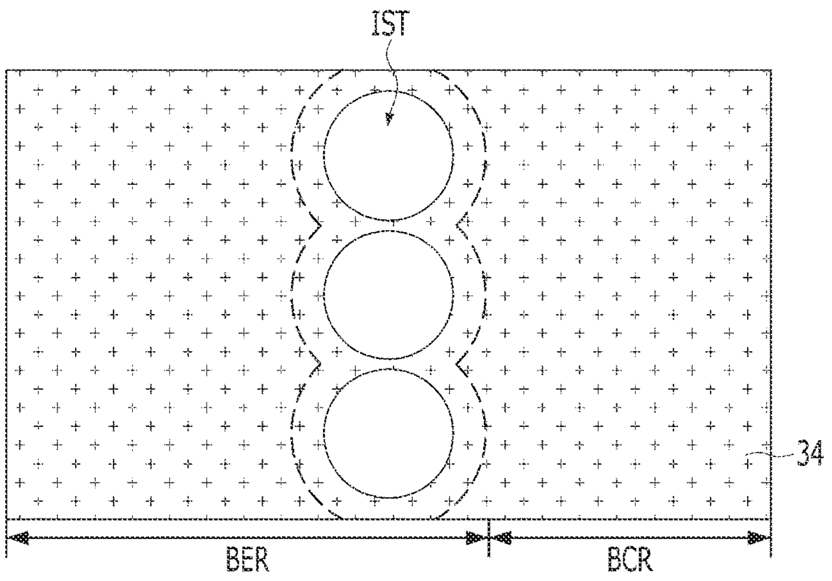
Figure 5B:
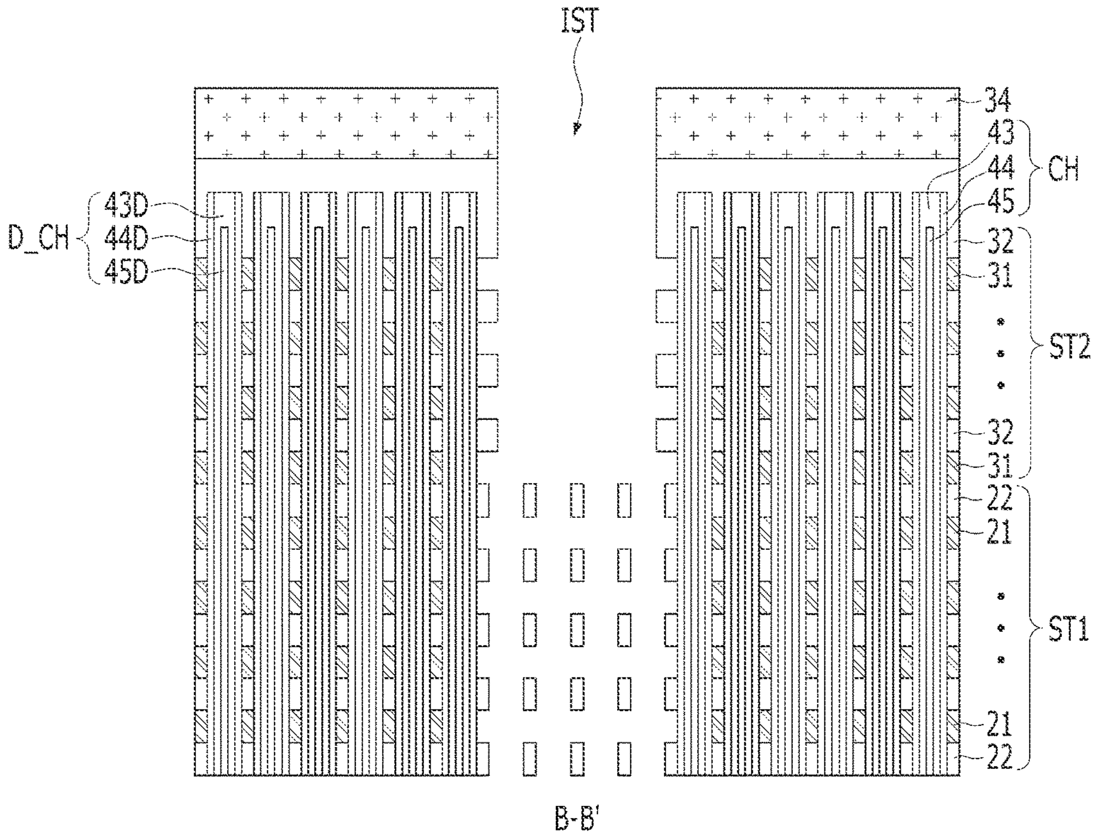

Referring to FIGS. 5A and 5B, the first sacrificial layers 23A may be removed through the dummy contact hole D_CTH. Through this, the first dummy holes DH1 may be reopened. Subsequently, the first material layers 21 and the third material layers 31 exposed through the first dummy holes DH1 and the dummy contact hole D_CTH may be etched. The first material layers 21 between adjacent first dummy holes DH1 may be removed, and the adjacent first dummy holes DH1 may be connected to each other. Irregularities may be formed on sidewalls of the dummy contact holes D_CTH. Through this, an isolation trench IST may be formed.

When the dummy channel structures D_CH were formed in a region where the isolation trench IST is to be formed, the dummy channel structures D_CH should be removed to form the isolation trench IST. According to an embodiment of the present disclosure, because the second dummy holes DH2 are not formed in the region where the isolation trench IST is to be formed, the dummy channel structures D_CH may not be formed in the corresponding region. Accordingly, it is possible to form the isolation trench IST without removing the dummy channel structures D_CH.

The first material layers 21 formed in the block center region BCR and the first material layers 21 formed in the block edge region BER may be isolated from each other by the isolation trench IST. The third material layers 31 formed in the block center region BCR and the third material layers 31 formed in the block edge region BER may be isolated from each other by the isolation trench IST. The first material layers 21 and the third material layers 31 may be selectively etched, and the second material layers 22 and the fourth material layers 32 may maintain a shape in which they extend from the block center region BCR to the block edge region BER.

Figure 6A:
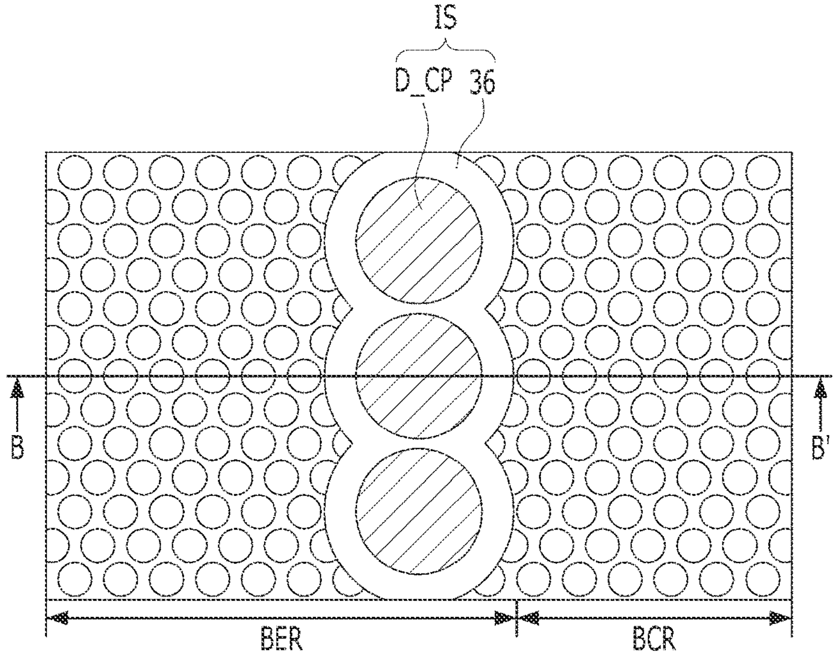
Figure 6B:
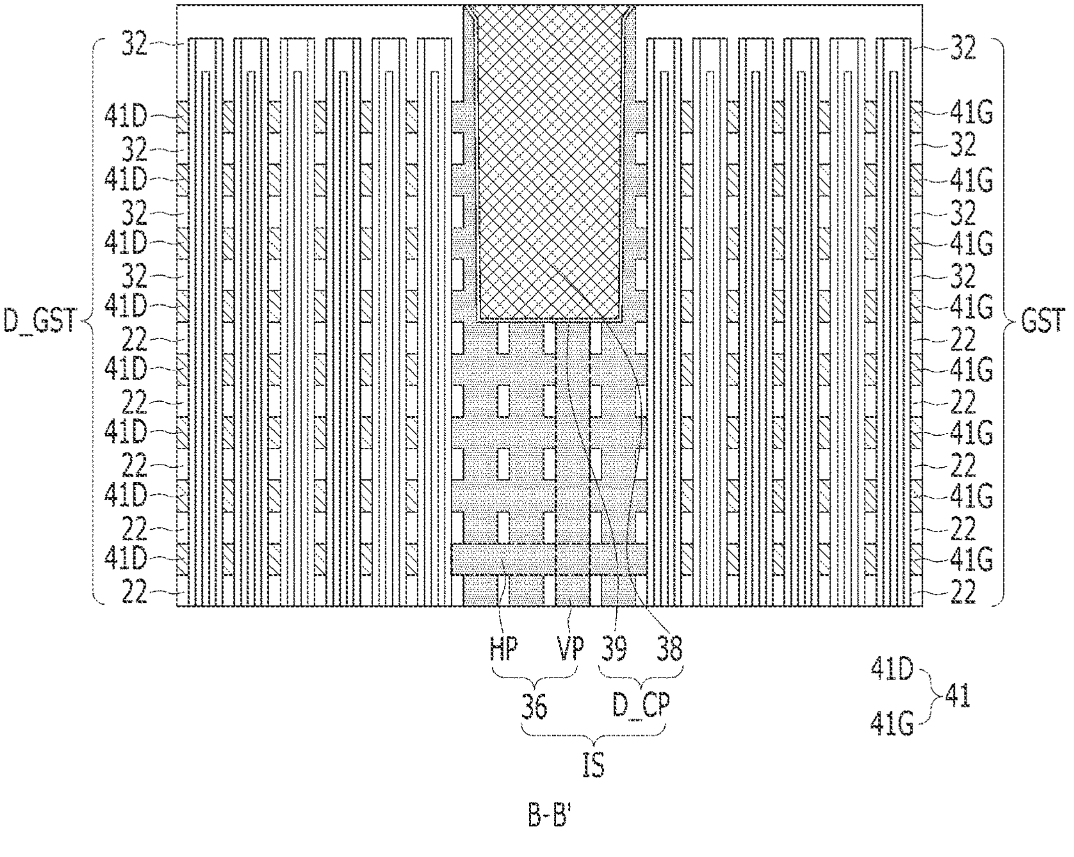

Referring to FIGS. 6A and 6B, an isolation insulating structure IS may be formed in the isolation trench IST. First, an isolation layer 36 may be formed in the isolation trench IST. The isolation layer 36 may include a material having a high etching selectivity with respect to the first material layers 21 and the third material layers 31. The isolation layer 36 may be formed by depositing an insulating material such as, for example, an oxide or a nitride. The isolation layer 36 may be formed at a thickness enough to fill the first dummy holes DH1, and may be formed along an inner surface of the dummy contact hole D_CTH. A central region of the dummy contact hole D_CTH may not be filled with the isolation layer 36, and may be opened. Subsequently, a dummy contact plug D_CP may be formed in the isolation layer 36. The dummy contact plug D_CP may be located in the dummy contact hole D_CTH. According to an example, a barrier layer 39 may be formed in the isolation layer 36, and a conductive plug 38 may be formed to gap fill the space defined by the barrier layer 39.

The first material layers 21 and the third material layers 31 may be replaced with fifth material layers 41. A replacement process may be performed through a slit. The fifth material layers 41 may each include metal such as, for example, tungsten or molybdenum, and may be gate lines 41G or dummy gate lines 41D. According to an example, the first material layers 21 and the third material layers 31 may be selectively etched, and the fifth material layers 41 may be respectively formed in regions where the first material layers 21 and the third material layers 31 are removed.

Through this, a gate structure GST located in the block center region BCR and a dummy gate structure D_GST located in the block edge region BER may be formed. The gate structure GST may include the gate lines 41G and the second material layers 22 that are alternately stacked and the gate lines 41G and the fourth material layers 32 that are alternately stacked. The dummy gate structure D_GST may include the dummy gate lines 41D and the second material layers 22 that are alternately stacked and the dummy gate lines 41D and the fourth material layers 32 that are alternately stacked.

According to the manufacturing method described above, when the channel structures CH are formed in the block center region BCR, the dummy channel structures D_CH may be formed in the block edge region BER. By making the pattern densities of the block center region BCR and the block edge region BER uniform, it is possible to reduce bending of an end of the stack ST when the first material layers 21 and the third material layers 31 are replaced with the fifth material layers 41. In addition, the isolation insulating structure IS may be formed using a process of forming the channel structure CH.

The exposed first material layers 21 and third material layers 31 around the first dummy holes DH1 and the dummy contact hole D_CTH may be replaced with the isolation layer 36. Through this, the first material layers 21 and the third material layers 31 may be removed in advance in a portion of the block edge region BER adjacent to the block center region BCR. Accordingly, the dummy gate structure D_GST and the gate structure GST may be isolated from each other by the isolation insulating structure IS.

FIGS. 7A, 8A, 9A, 10A, 11A, 12A, 13A, 14A, 15A, 16A, and 17A and FIGS. 7B, 8B, 9B, 10B, 11B, 12B, 13B, 14B, 15B, 16B, and 17B are diagrams for describing a manufacturing method of a semiconductor device in accordance with an embodiment of the present disclosure. Hereinafter, the content overlapping with the previously described content may be omitted.

Figure 7A:
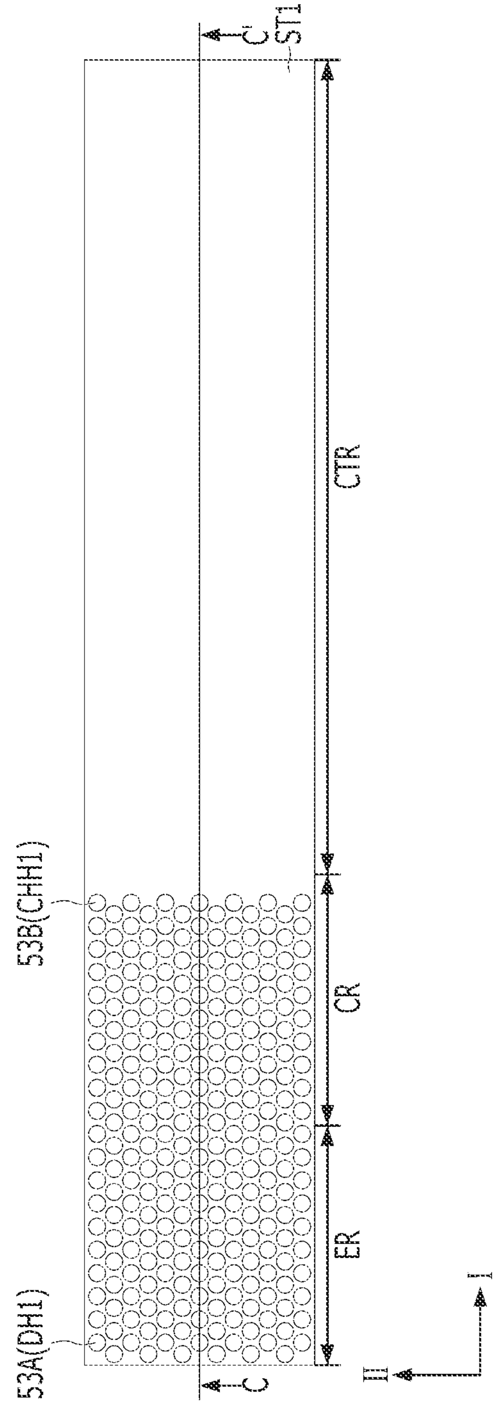
FIGS. 7A, 8A, 9A, 10A, 11A, 12A, 13A, 14A, 15A, 16A, and 17A and FIGS. 7B, 8B, 9B, 10B, 11B, 12B, 13B, 14B, 15B, 16B, and 17B are diagrams for describing a manufacturing method of a semiconductor device in accordance with an embodiment of the present disclosure.
Figure 7B:
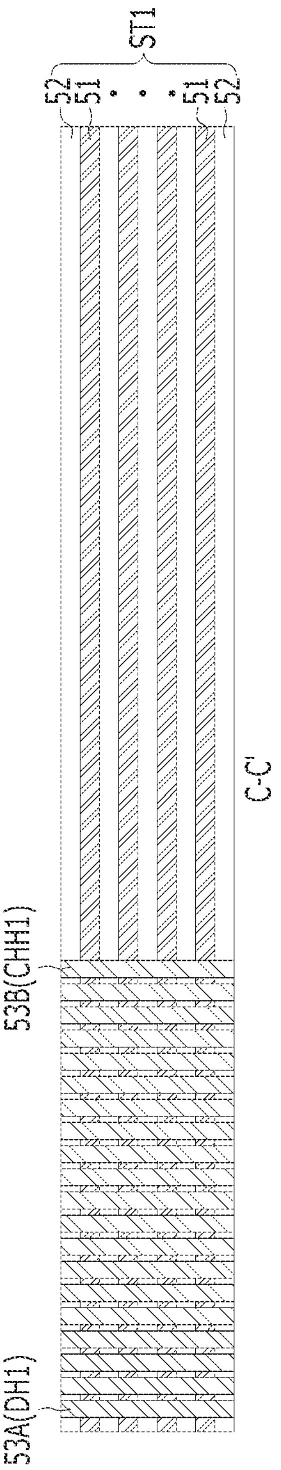

Referring to FIGS. 7A and 7B, a first stack ST1 may be formed including alternating first and second material layers 51 and 52. According to an example, the first stack ST1 may be formed in a center region and an edge region of a memory block. The first stack ST1 may include a cell region CR, a contact region CTR, and an edge region ER arranged along the first direction I (See FIG. 8A). The edge region ER may be an end or edge region of the first stack ST1. The cell region CR may be located between the edge region ER and the contact region CTR.

Subsequently, first dummy holes DH1 may be formed in the first stack ST1. The first dummy holes DH1 may be located in the edge region ER. First channel holes CHH1 may be formed in the first stack ST1. The first channel holes CHH1 may be located in the cell region CR. When the first dummy holes DH1 are formed, the first channel holes CHH1 may be formed. The first dummy holes DH1 and the first channel holes CHH1 may be formed at the same time. The first dummy holes DH1 and the first channel holes CHH1 may be formed with a uniform pattern density in the edge region ER and the cell region CR, respectively.

Subsequently, first sacrificial layers 53A may be formed in the first dummy holes DH1. First sacrificial layers 53B may be formed in the first channel holes CHH1. When the first sacrificial layers 53A are formed, the first sacrificial layers 53B may be formed. The first sacrificial layers 53A and the first sacrificial layers 53B may be formed at the same time.

Figure 8A:
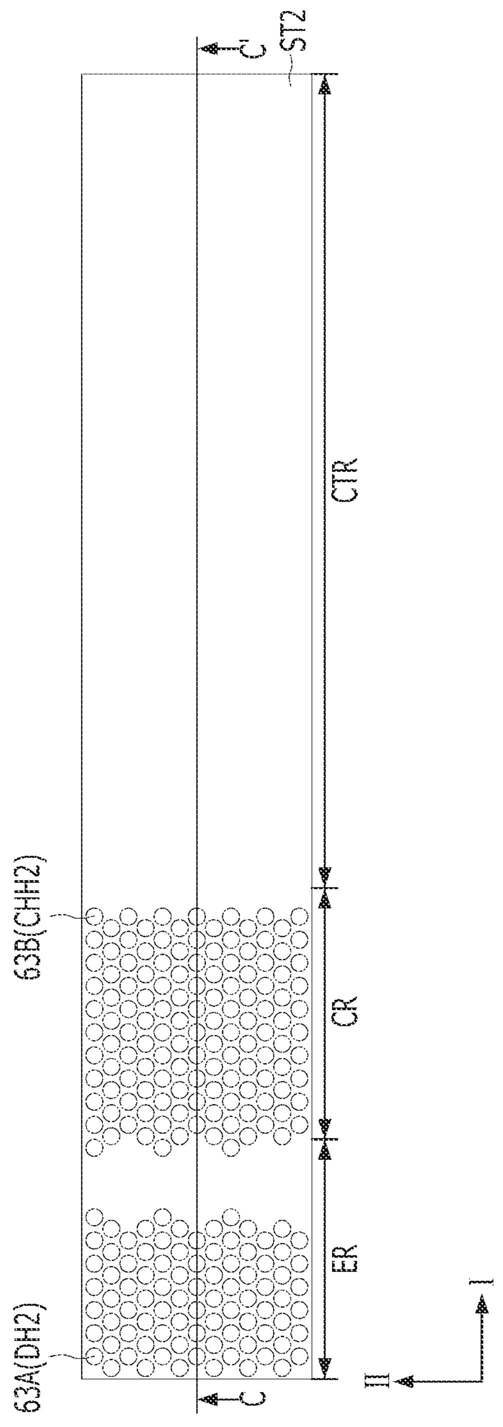
Figure 8B:
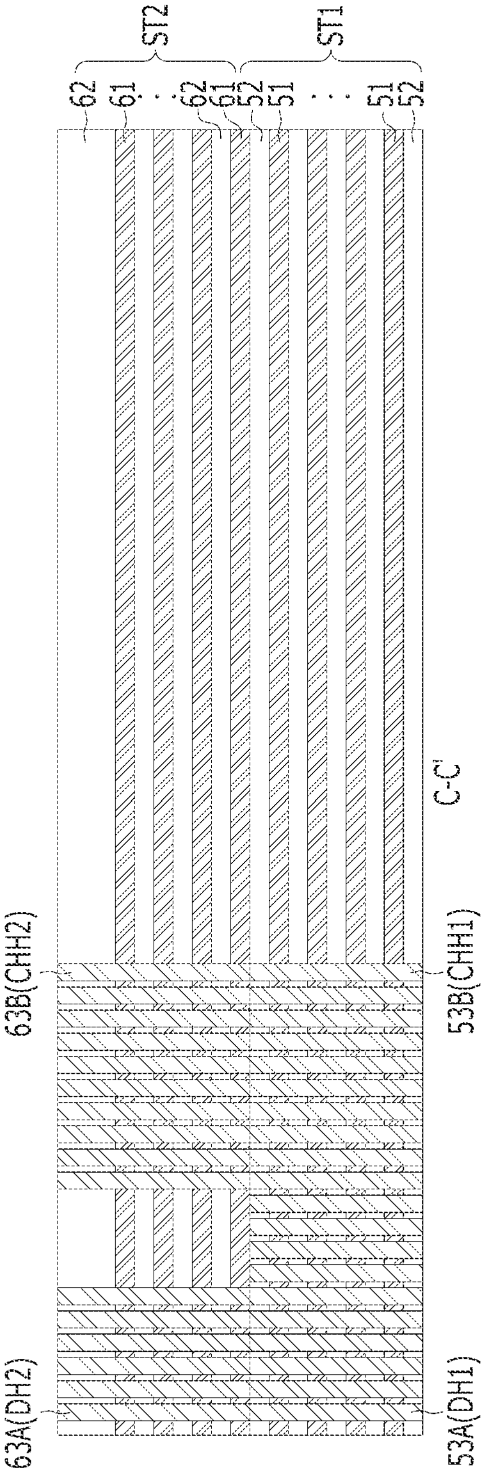

Referring to FIGS. 8A and 8B, a second stack ST2 may be formed on the first stack ST1. The second stack ST2 may include third material layers 61 and fourth material layers 62 that are alternately stacked. The second stack ST2 may include a cell region CR, a contact region CTR, and an edge region ER. The edge region ER may be an end of the second stack ST2. The cell region CR may be located between the edge region ER and the contact region CTR.

Subsequently, second dummy holes DH2 may be formed in the second stack ST2. The second dummy holes DH2 may be located in the edge region ER, and may be connected to the first dummy holes DH1. The second dummy holes DH2 may not be formed in a portion of the edge region ER adjacent to the cell region CR. Second channel holes CHH2 may be formed in the second stack ST2. The second channel holes CHH2 may be located in the cell region CR, and may be connected to the first channel holes CHH1. When the second dummy holes DH2 are formed, the second channel holes CHH2 may be formed.

Subsequently, second sacrificial layers 63A may be formed in the second dummy holes DH2. The second sacrificial layers 63A may each include a material having a high etching selectivity with respect to the third material layers 61 and the fourth material layers 62. Second sacrificial layers 63B may be formed in the second channel holes CHH2. The second sacrificial layers 63B may each include a material having a high etching selectivity with respect to the third material layers 61 and the fourth material layers 62. When the second sacrificial layers 63A are formed, the second sacrificial layers 63B may be formed.

Figure 9A:
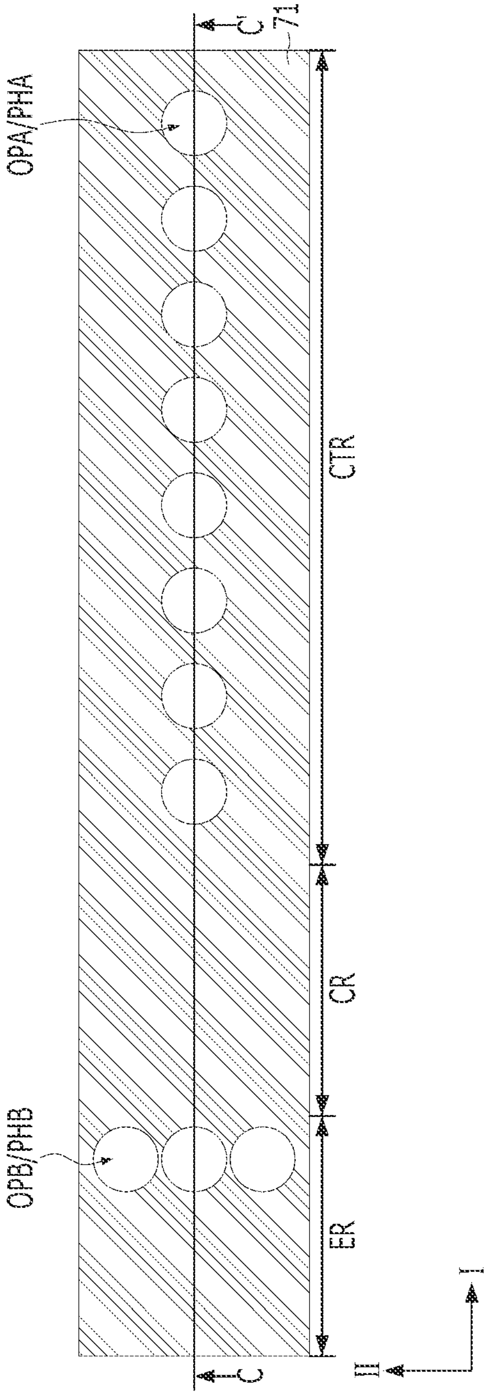
Figure 9B:
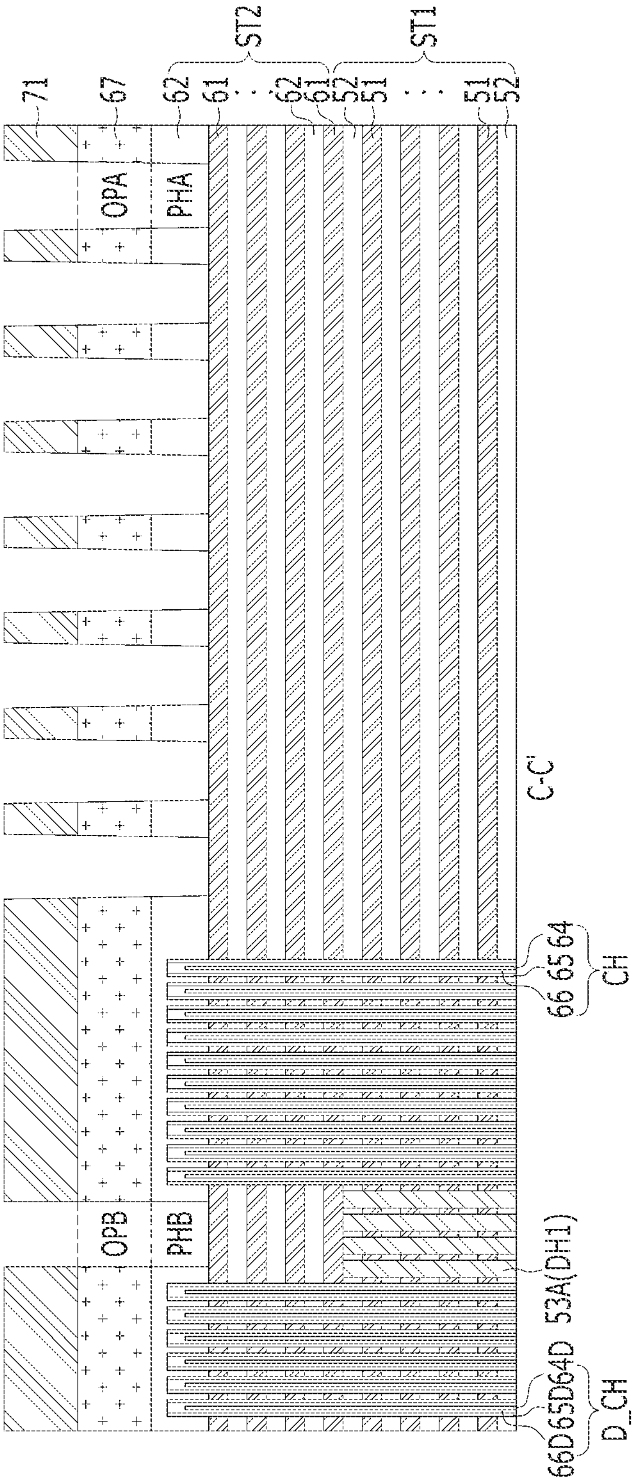

Referring to FIGS. 9A and 9B, the first dummy holes DH1 and the second dummy holes DH2 may be reopened by removing the second sacrificial layers 63A and the first sacrificial layers 53A. The first channel holes CHH1 and the second channel holes CHH2 may be reopened by removing the second sacrificial layers 63B and the first sacrificial layers 53B. When the first dummy holes DH1 and the second dummy holes DH2 are reopened, the first channel holes CHH1 and the second channel holes CHH2 may be reopened.

Subsequently, dummy channel structures D_CH may be formed in the first dummy holes DH1 and the second dummy holes DH2 connected to each other. Channel structures CH may be formed in the first channel holes CHH1 and the second channel holes CHH2 connected to each other. The channel structure CH may include at least one of a channel layer 64, a memory layer 65, and an insulating core 66. The dummy channel structure D_CH may include at least one of a dummy channel layer 64D, a dummy memory layer 65D, and a dummy insulating core 66D. When the channel structures CH are formed, the dummy channel structures D_CH may be formed.

Subsequently, a hard mask pattern 67 may be formed on the second stack ST2. According to an example, the hard mask pattern 67 may be formed by forming a hard mask layer on the second stack ST2 and etching the hard mask layer using a first mask pattern 71 as an etching barrier. The hard mask pattern 67 may include openings OPA corresponding to locations where contact plugs are to be formed in a subsequent process and openings OPB corresponding to locations where dummy contact plugs are to be formed in the subsequent process. The second stack ST2 may be exposed through the openings OPA and OPB. In a process of forming the hard mask pattern 67, the second stack ST2 may be partially etched, and preliminary contact holes PHA connected to the openings OPA and preliminary contact holes PHB connected to the openings OPB may be formed. The hard mask pattern 67 may include polysilicon, and the first mask pattern 71 may include a photoresist.

Figure 10A:
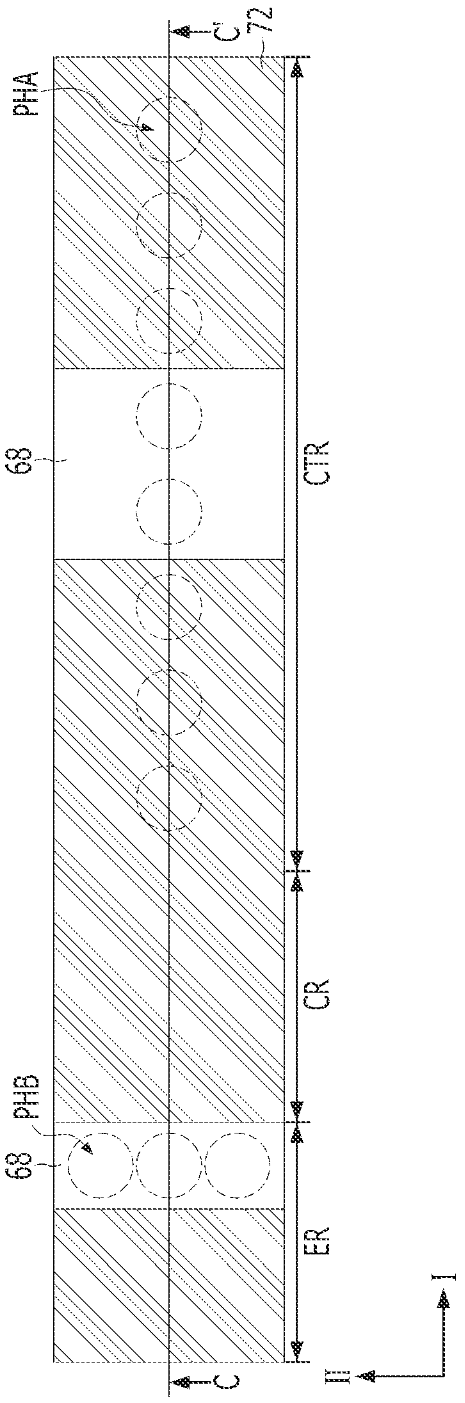
Figure 10B:
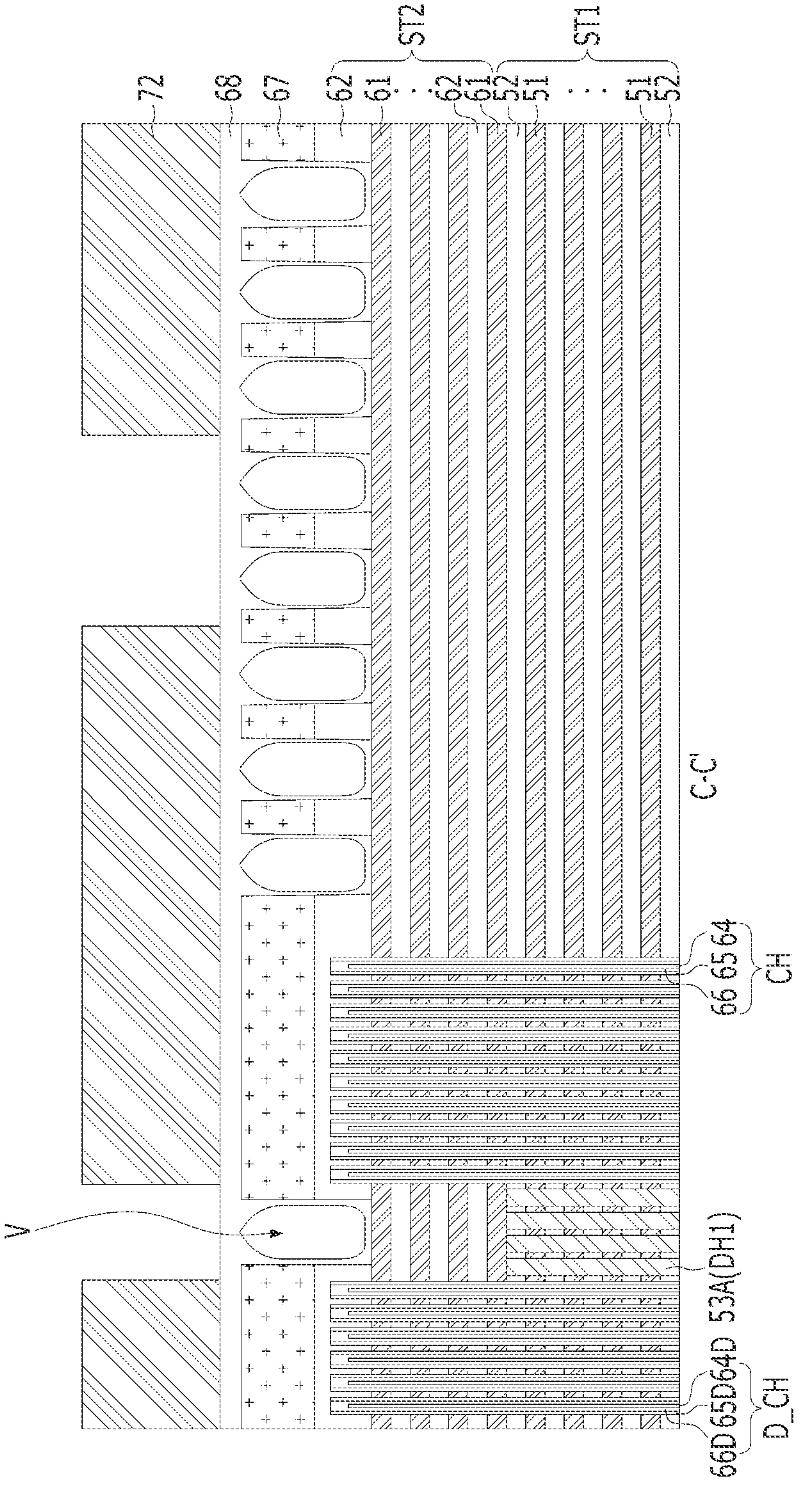

Referring to FIGS. 10A and 10B, a sacrificial layer 68 may be formed on the hard mask pattern 67, and a second mask pattern 72 may be formed on the sacrificial layer 68. The sacrificial layer 68 may be formed in the preliminary contact holes PHA and PHB, and may include voids V respectively located in the preliminary contact holes PHA and PHB. The sacrificial layer 68 may include amorphous carbon, and the second mask pattern 72 may include a photoresist.

Figure 11A:
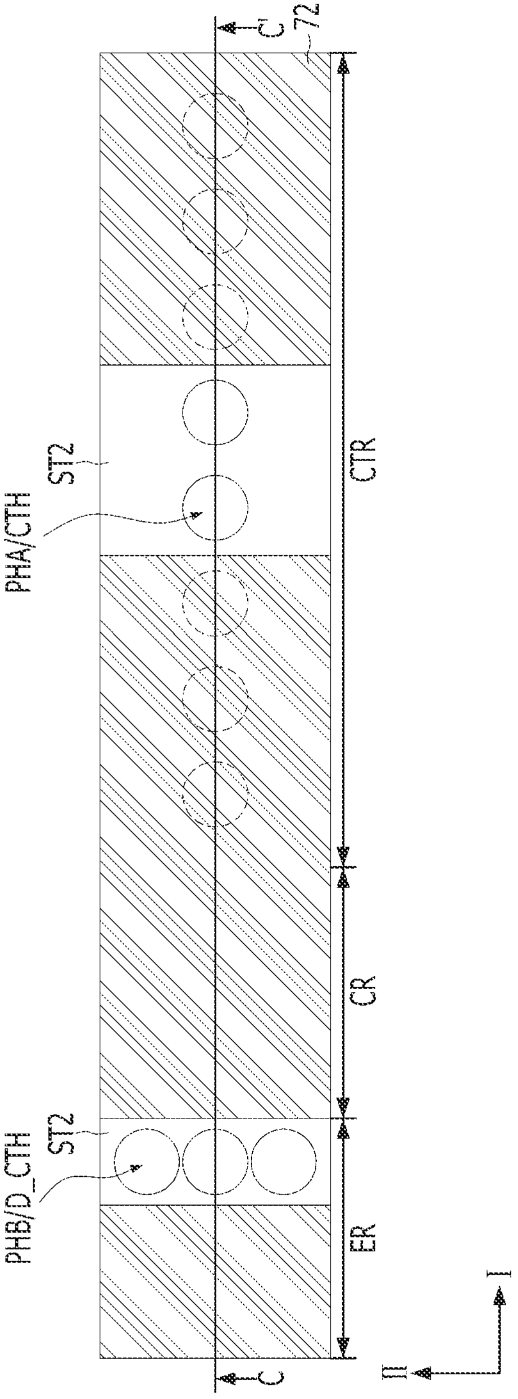
Figure 11B:
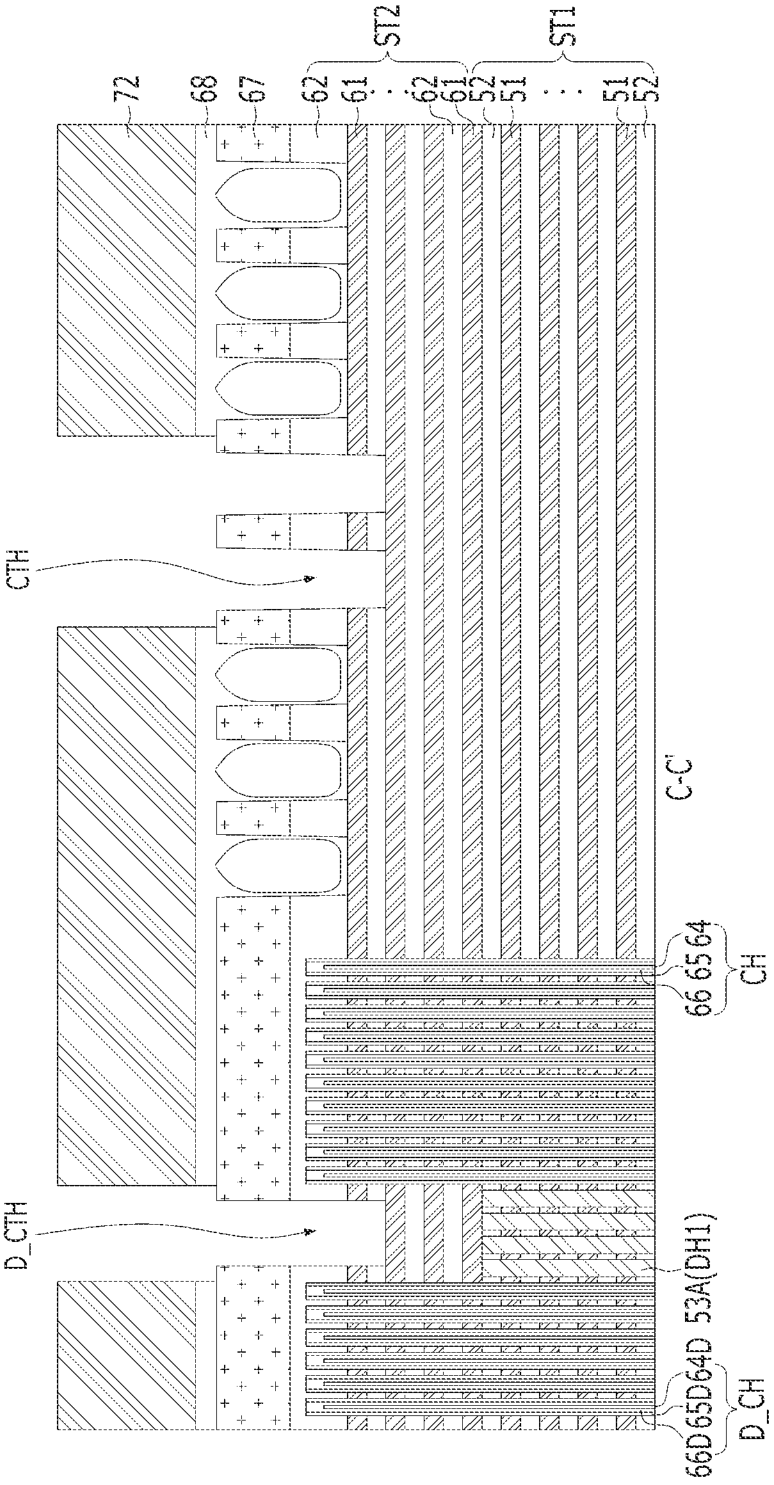

Referring to FIGS. 11A and 11B, the sacrificial layer 68 may be etched using the second mask pattern 72 as an etching barrier. Through this, at least one of the preliminary contact holes PHA may be exposed, and the preliminary contact holes PHB may be exposed. Subsequently, the second stack ST2 may be etched using the second mask pattern 72 and the hard mask pattern 67 as etching barriers. Through this, the exposed preliminary contact holes PHA and PHB may extend into the second stack ST2. Contact holes CTH may be formed in the contact region CTR, and dummy contact holes D_CTH may be formed in the edge region ER. The contact holes CTH and the dummy contact holes D_CTH may have substantially the same depth.

Figure 12A:
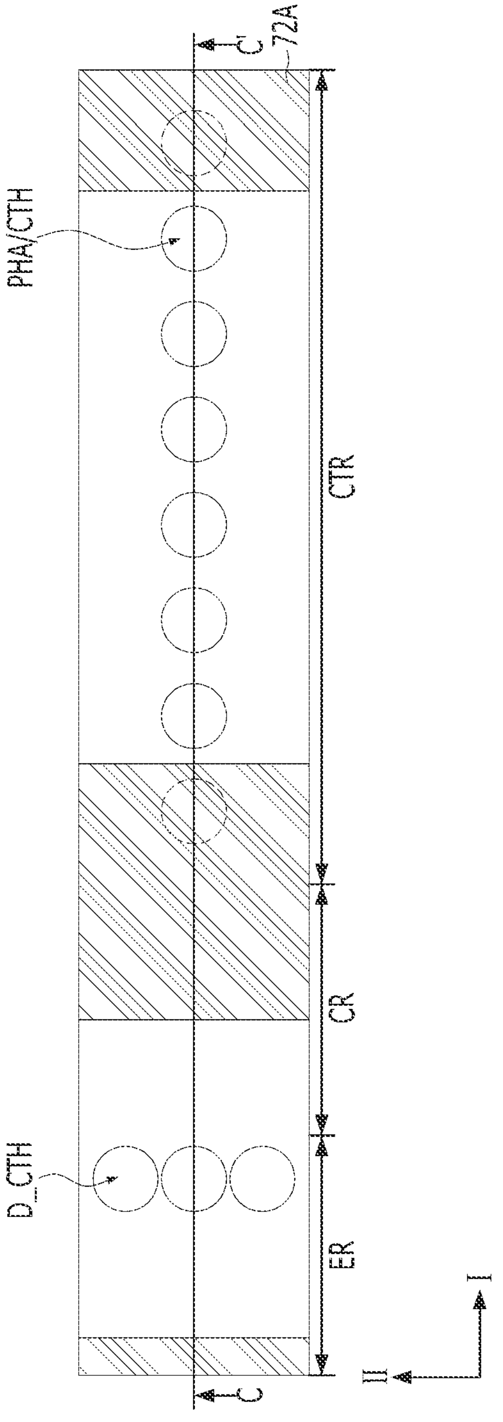
Figure 12B:
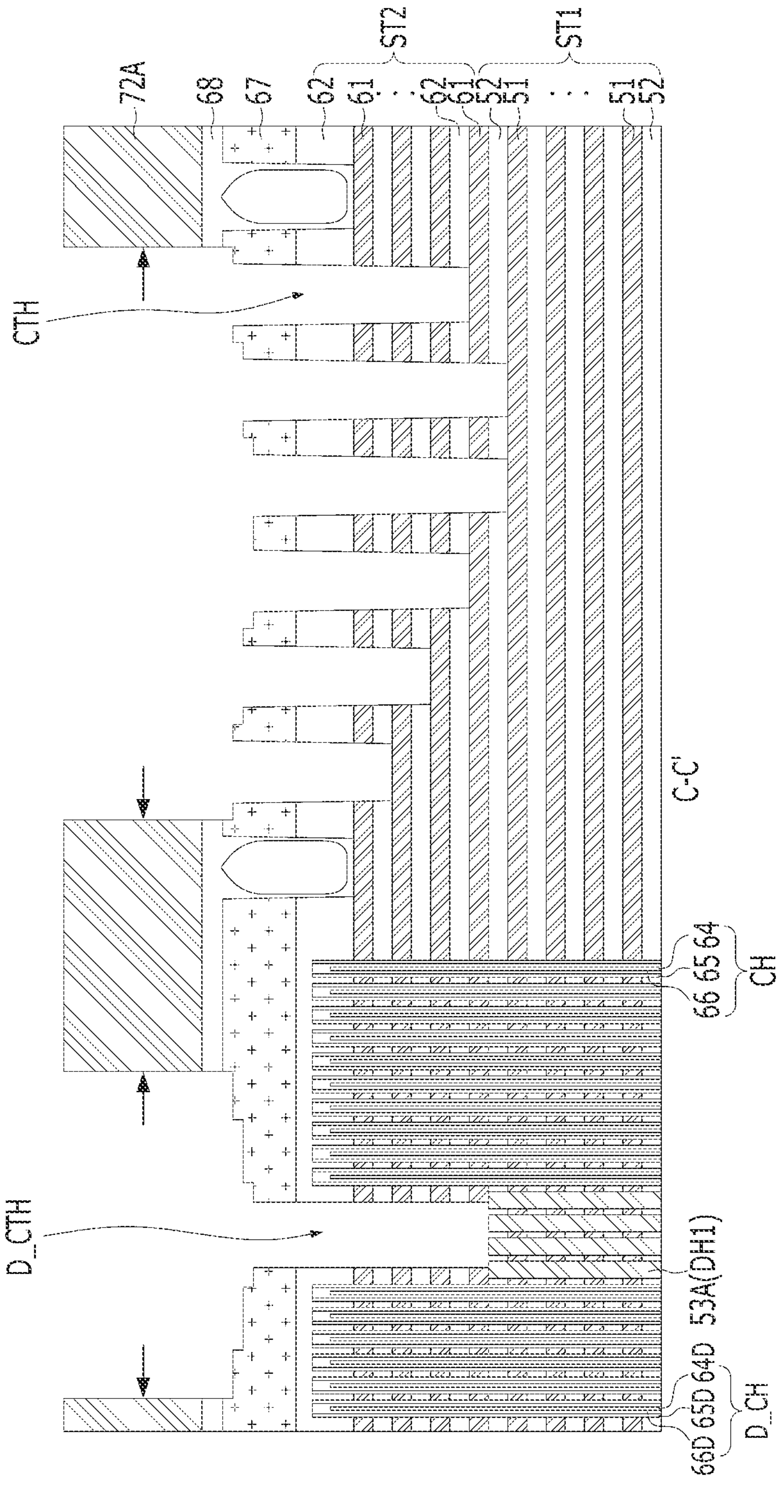

Referring to FIGS. 12A and 12B, the second mask pattern 72 may be reduced. By etching the second mask pattern 72 to expand openings, the number of exposed preliminary contact holes PHA may be increased. Subsequently, the sacrificial layer 68 may be etched using the reduced second mask pattern 72A as an etching barrier. Subsequently, the second stack ST2 may be etched using the second mask pattern 72A and the hard mask pattern 67 as etching barriers. Through this, the previously formed contact holes CTH and dummy contact holes D_CTH may extend into the second stack ST2. The newly exposed preliminary contact holes PHA may extend into the second stack ST2.

A process of reducing the second mask pattern 72A and etching the sacrificial layer 68 and the second stack ST2 may be repeatedly performed. Through this, contact holes CTH respectively exposing the third material layers 61 included in the second stack ST2 may be formed. At least one of the contact holes CTH may extend into the first stack ST1, and may expose at least one of the first material layers 51. In addition, a dummy contact hole D_CTH exposing the first sacrificial layers 53A may be formed. When the contact holes CTH are formed, the dummy contact hole D_CTH may be formed. As the contact holes CTH extend into the second stack ST2, the dummy contact hole D_CTH may also extend into the second stack ST2. When the contact hole CTH extends into the first stack ST1, the dummy contact hole D_CTH may also extend into the first stack ST1. A contact hole CTH having the greatest depth among the contact holes CTH and the dummy contact hole D_CTH may have substantially the same depth. The dummy contact hole D_CTH may expose the first sacrificial layers 53A, and may be connected to the first dummy holes DH1.

For reference, as the process of reducing the second mask pattern 72A and etching the sacrificial layer 68 and the second stack ST2 is repeatedly performed, an upper surface of the hard mask pattern 67 may be etched. Irregularities, stair structures, or the like, may be formed on the upper surface of the hard mask pattern 67.

Figure 13A:
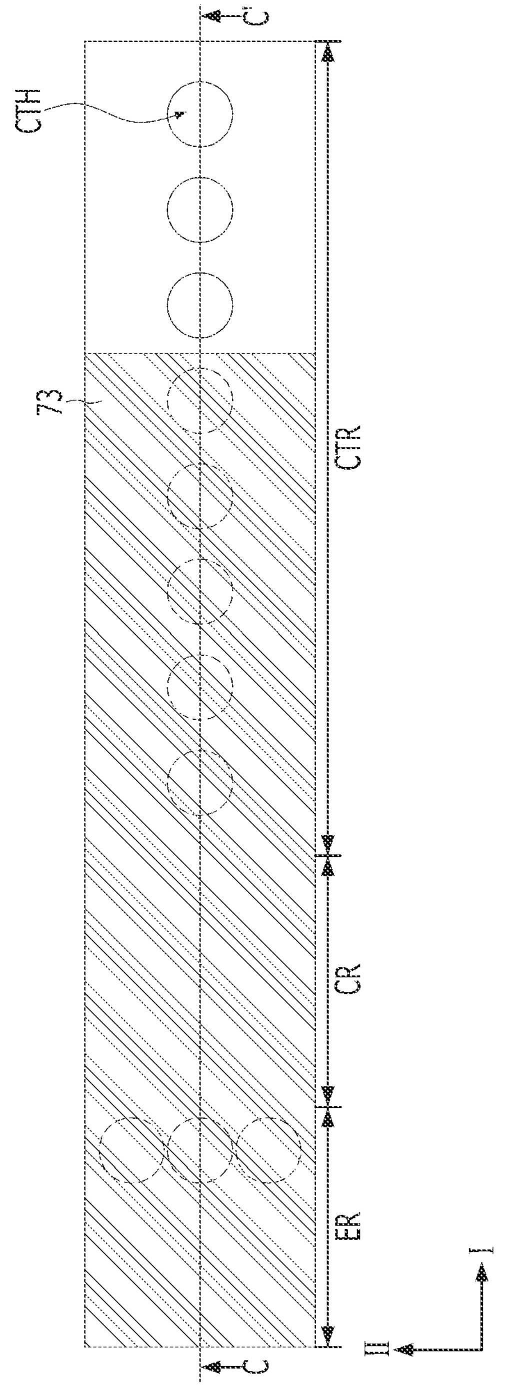
Figure 13B:
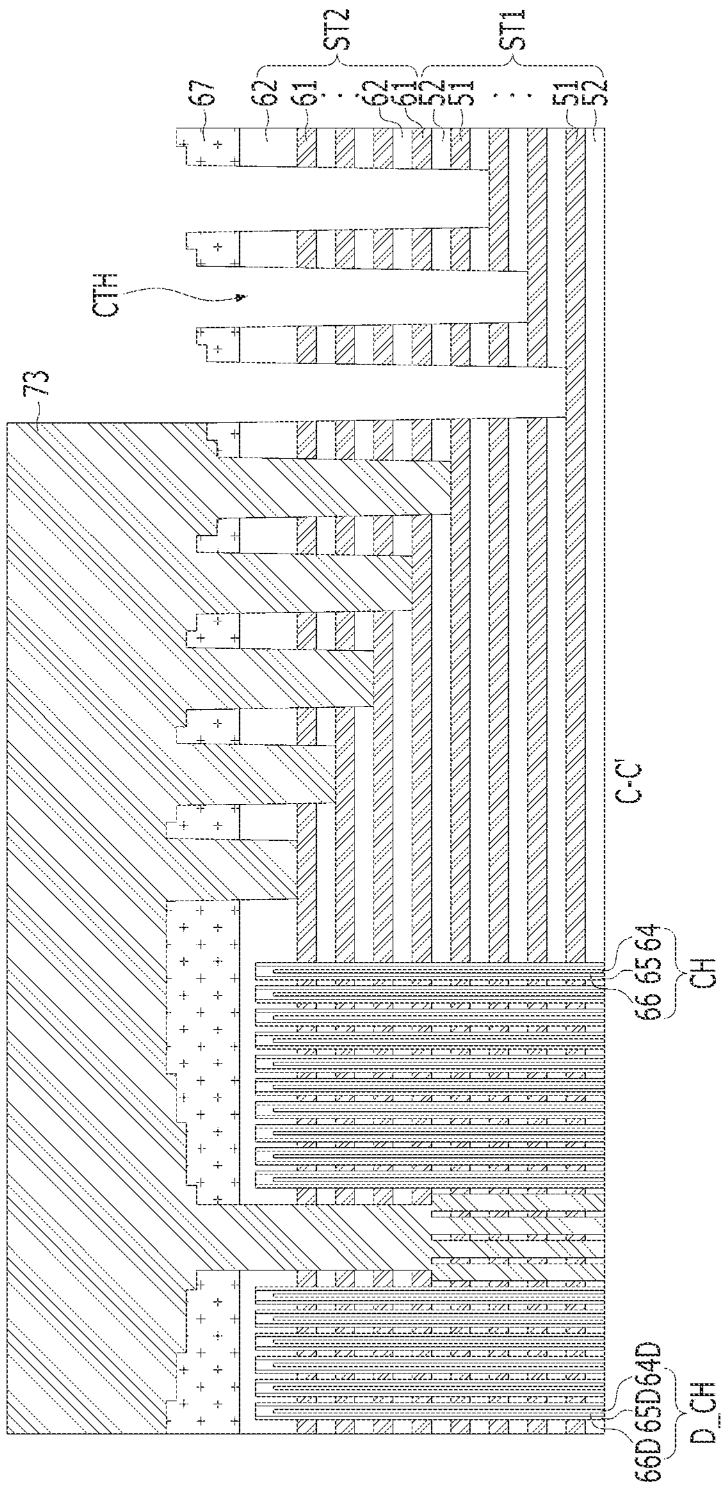

Referring to FIGS. 13A and 13B, the second mask pattern 72 and the sacrificial layer 68 may be removed. Subsequently, the first sacrificial layers 53A in the first dummy holes DH1 may be removed through the dummy contact hole D_CTH. For reference, when the second mask pattern 72 or the sacrificial layer 68 is removed, the first sacrificial layers 53A may be removed.

Subsequently, a third mask pattern 73 may be formed. The third mask pattern 73 may cover the edge region ER and the cell region CR, and may expose a portion of the contact region CTR. The third mask pattern 73 may cover some of the contact holes CTH and expose the other contact holes CTH. The third mask pattern 73 may be formed in the first dummy holes DH1 and the dummy contact hole D_CTH, and may be formed in some of the contact holes CTH. The third mask pattern 73 may include a photoresist.

Subsequently, the first stack ST1 may be etched using the third mask pattern 73 and the hard mask pattern 67 as etching barriers. Through this, the other contact holes CTH may extend into the first stack ST1. The extending other contact holes CTH may expose the first material layers 51, respectively. Accordingly, the contact holes CTH may have different depths, and may expose the first material layers 51 and the third material layers 61, respectively.

Figure 14A:
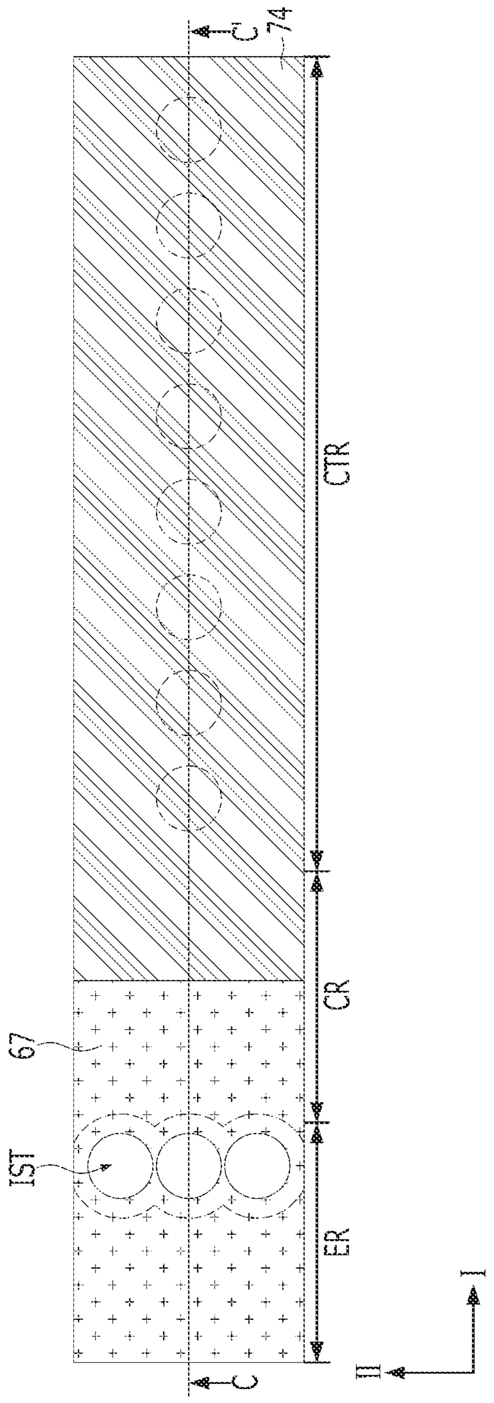
Figure 14B:
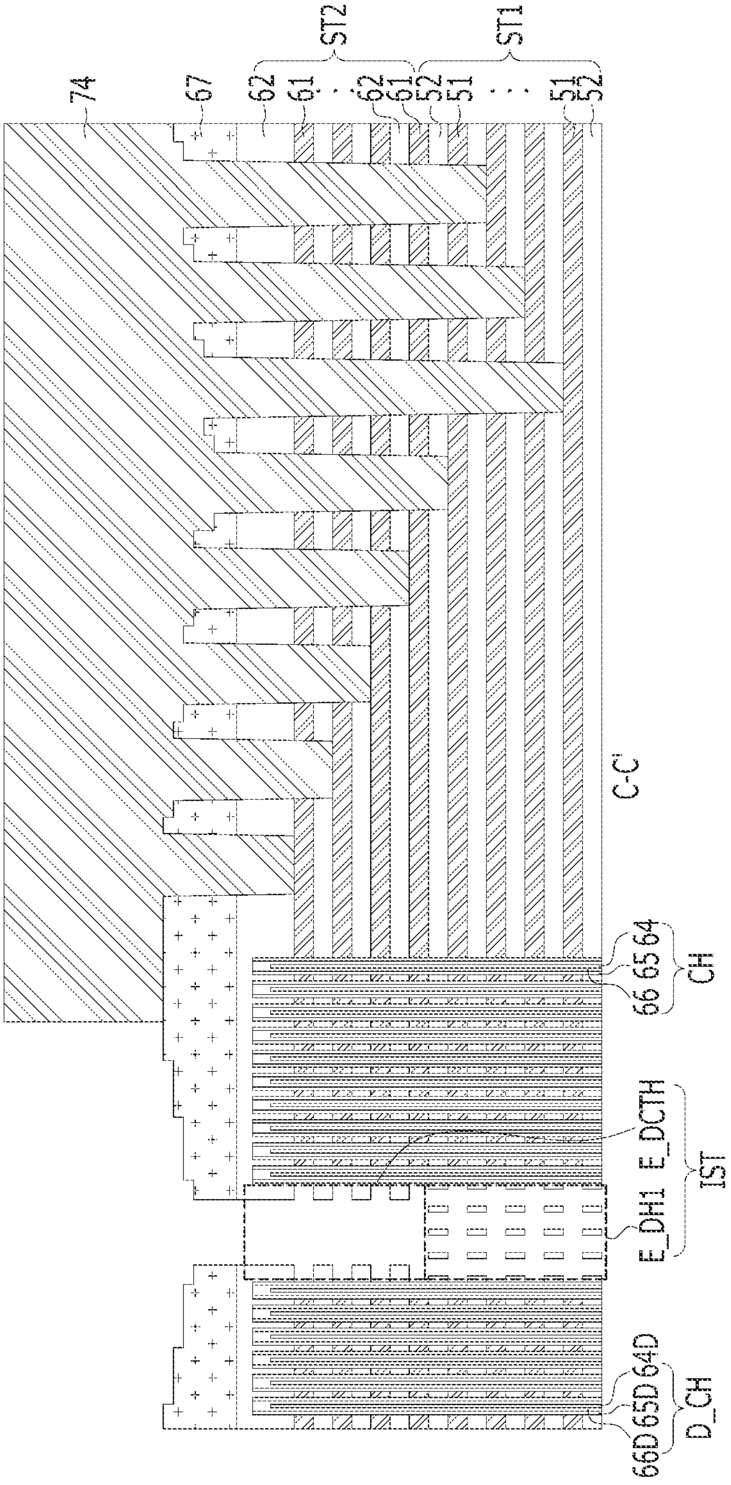

Referring to FIGS. 14A and 14B, the third mask pattern 73 may be removed. Subsequently, a fourth mask pattern 74 may be formed. The fourth mask pattern 74 may cover the contact region CTR and may expose the edge region ER. The fourth mask pattern 74 may cover at least a portion of the cell region CR. Through this, the first dummy holes DH1 and the dummy contact hole D_CTH may be exposed. The fourth mask pattern 74 may be formed in the contact holes CTH. The fourth mask pattern 74 may include a photoresist.

Subsequently, the first material layers 51 and the third material layers 61 may be etched through the dummy contact hole D_CTH and the first dummy holes DH1. Through this, an isolation trench IST may be formed in the first stack ST1 and the second stack ST2.

By selectively etching the first material layers 51, the first dummy holes DH1 may be expanded in a horizontal direction and may be connected to each other. The expanded first dummy holes E_DH1 may be located in the first stack ST1. By selectively etching the third material layers 61, the dummy contact hole D_CTH may be expanded in the horizontal direction. The expanded dummy contact hole E_DCTH may be located in the second stack ST2. Depending on an interval between dummy contact holes D_CTH adjacent to each other in the second direction II, the expanded dummy contact holes E_DCTH may be connected to or isolated from each other. Through this, the isolation trench IST including the expanded first dummy holes E_DH1 and the expanded dummy contact hole E_UTH may be formed.

Figure 15A:
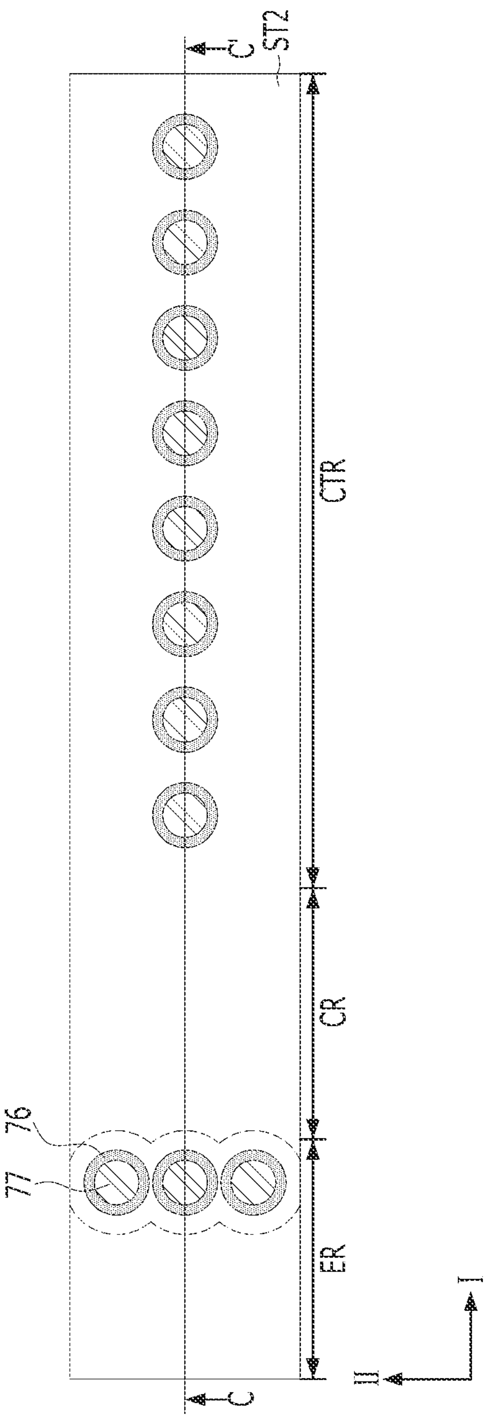
Figure 15B:
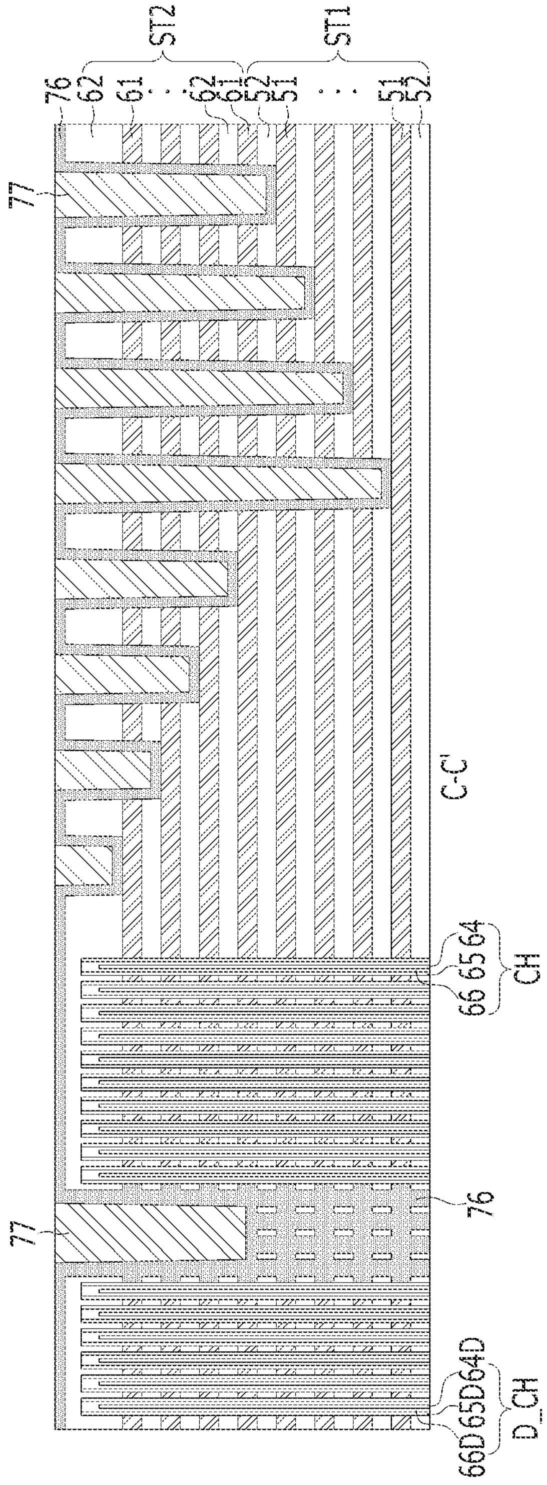

Referring to FIGS. 15A and 15B, an insulating liner 76 may be formed in the isolation trench IST. The insulating liner 76 may partially fill the isolation trench IST. According to an example, the insulating liner 76 may be filled in the expanded first dummy holes E_DH1, and may extend along inner walls of the expanded dummy contact hole E_DCTH. A central region of the expanded dummy contact hole E_DCTH may be opened without being filled with the insulating liner 76.

An insulating liner 76 may be formed in the contact holes CTH. The insulating liner 76 may be formed along an inner surface of the contact hole CTH, and may partially fill the contact hole CTH. The insulating liner 76 may extend along an upper surface of the second stack ST2. The insulating liner 76 formed in the isolation trench IST and the insulating liner 76 formed in the contact holes CTH may be connected to each other.

The insulating liner 76 may include a material having a high etching selectivity with respect to the first material layers 51 and the third material layers 61. The insulating liner 76 may include an insulating material such as, for example, an oxide or a nitride. By forming the insulating liner 76 using the insulating material, it is possible to reduce generation of a bridge between gate lines formed in a subsequent process.

Subsequently, sacrificial layers 77 may be formed in the insulating liners 76. The sacrificial layers 77 may be located in the expanded dummy contact hole E_DCTH and the contact holes CTH, respectively. The sacrificial layers 77 may include a material having an etching selectivity with respect to the insulating liner 76. According to an example, the sacrificial layers 77 may include polysilicon.

Figure 16A:
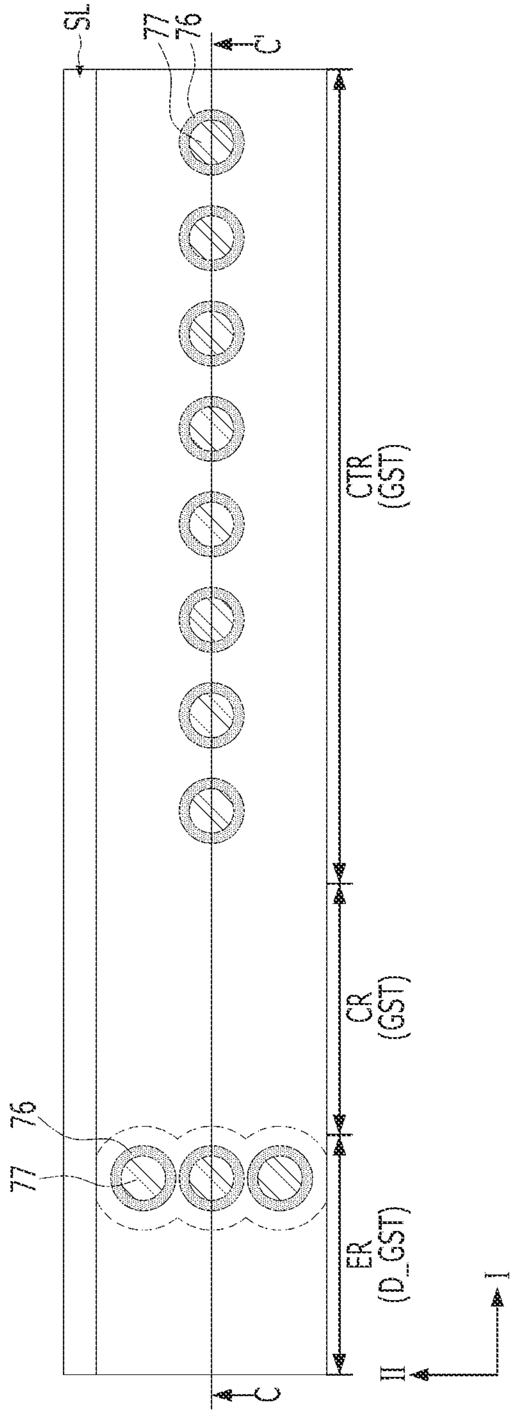
Figure 16B:
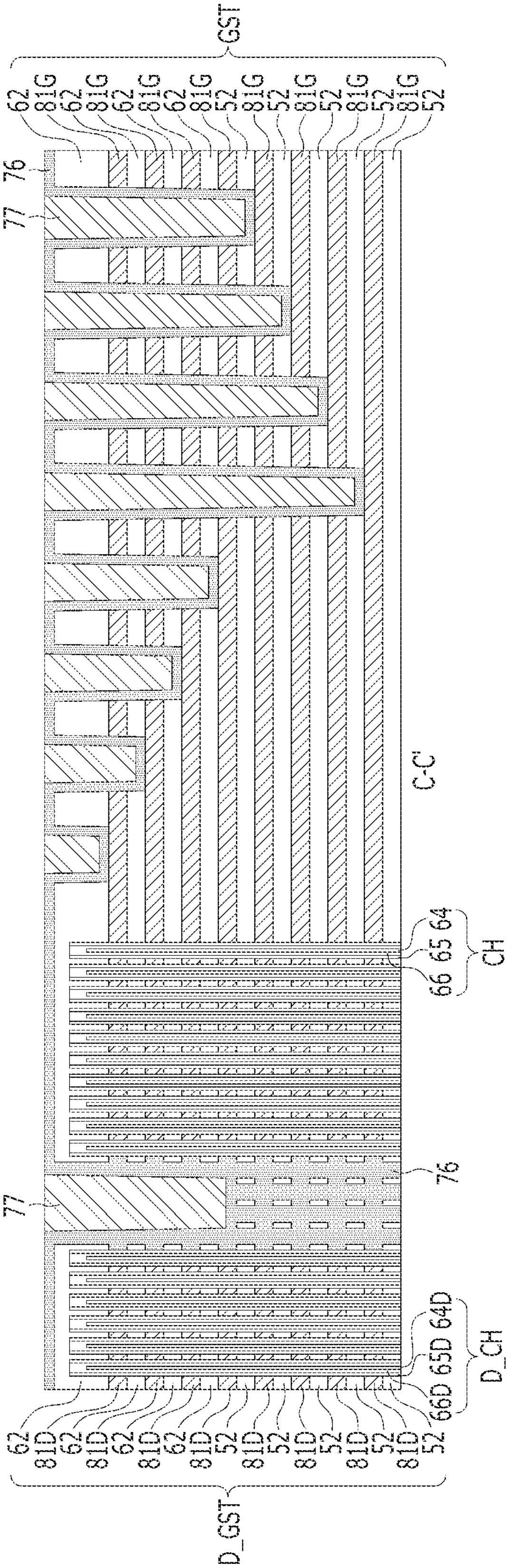

Referring to FIGS. 16A and 16B, the first material layers 51 and the third material layers 61 may be replaced with fifth material layers 81. According to an example, a slit SL extending through the second stack ST2 and the first stack ST1 may be formed. Subsequently, openings may be formed by selectively etching the first material layers 51 and the third material layers 61 through the slit SL. When the first material layers 51 and the third material layers 61 are etched, the insulating liners 76 may be used as an etch stop layer. Subsequently, the fifth material layers 81 may be formed in the openings. The fifth material layers 81 may be gate lines 81G or dummy gate lines 81D. Through this, a gate structure GST located in the cell region CR and the contact region CTR may be formed. A dummy gate structure D_GST located in the edge region ER may be formed.

Figure 17A:
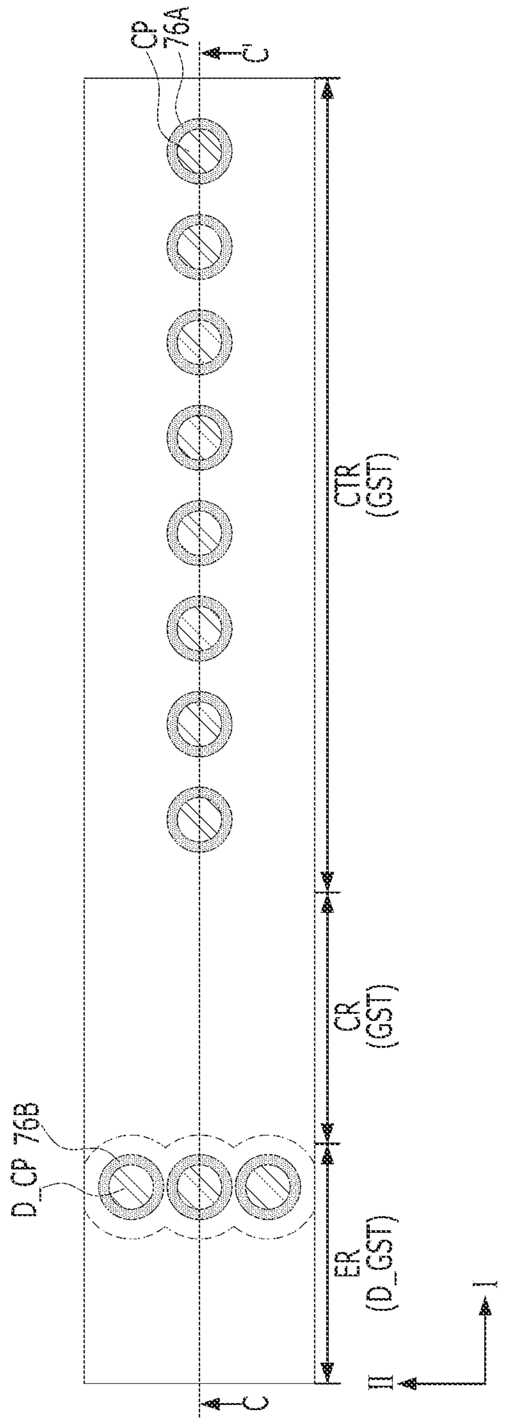
Figure 17B:
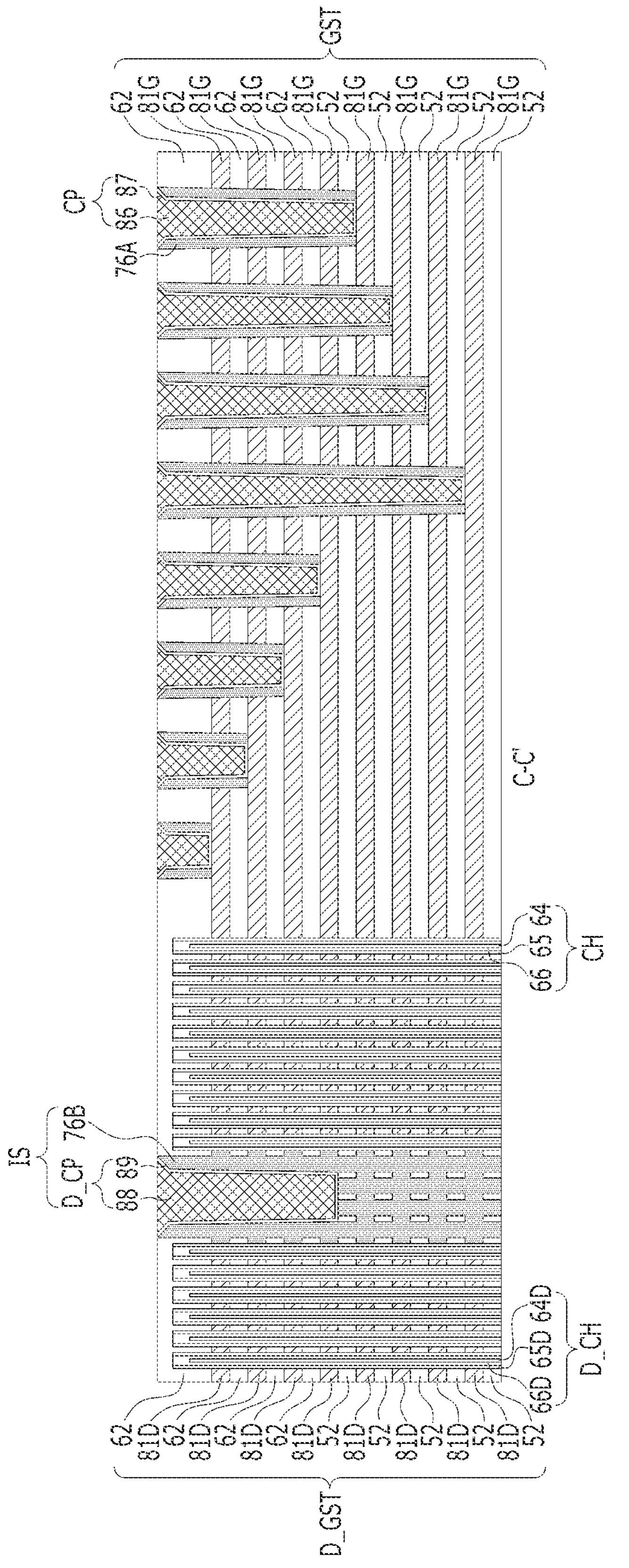

Referring to FIGS. 17A and 17B, the sacrificial layers 77 may be removed. According to an example, the sacrificial layers 77 may be removed using a dip-out process. Subsequently, insulating spacers 76A may be formed in the contact holes CTH, respectively. An isolation layer 76B may be formed in the isolation trench IST. According to an example, the insulating liner 76 may be etched using an etch-back process. Through this, a portion of the insulating liner 76 formed on an upper surface of the gate structure GST and a portion of the insulating liner 76 formed on an upper surface of the dummy gate structure D_GST may be removed. Portions of the insulating liner 76 formed on bottom surfaces of the contact holes CTH may be removed, and the gate lines 81G may be exposed. A portion of the insulating liner 76 formed in the isolation trench IST may be partially etched.

Subsequently, contact plugs CP may be formed. The contact plugs CP may be located in the contact holes CTH, respectively, and may be electrically connected to the gate lines 81G. A barrier layer 87 may be formed in the contact hole CTH, and a conductive plug 86 may be formed to gap fill the space defined by the barrier layer 87. A dummy contact plug D_CP may be formed. The dummy contact plug D_CP may be located in the dummy contact hole D_CTH. A barrier layer 89 may be formed in the isolation layer 76B, and a conductive plug 88 may be formed to gap fill the space defined by the barrier layer 89. Through this, an isolation insulating structure IS including the isolation layer 76B and the dummy contact plug D_CP may be formed.

The dummy contact plug D_CP may have an electrically floated state. When the dummy contact plug D_CP is formed, the contact plug CP may be formed also.

According to the manufacturing method described above, when the channel structures CH are formed in the cell region CR, the dummy channel structures D_CH may be formed in the edge region ER. By making the pattern densities of the cell region CR and the edge region ER uniform, it is possible to reduce bending of the first and second stacks ST1 and ST2 when the slit SL is formed. A shape of the slit SL may not be changed to prevent the bending of the first and second stacks ST1 and ST2. The slit SL may be formed in a line shape having a uniform width. In addition, the isolation insulating structure IS may be formed using a process of forming the channel structure CH and a process of forming the contact plug CP.

Although embodiments according to the technical idea of the present disclosure have been described above with reference to the accompanying drawings, this is only for describing the embodiments according to the concept of the present disclosure, and the present disclosure is not limited to the above embodiments. Various types of substitutions, modifications, and changes for the embodiments may be made by those skilled in the art, to which the present disclosure pertains, without departing from the technical idea of the present disclosure defined in the following claims, and it should be construed that these substitutions, modifications, and changes belong to the scope of the present disclosure. Furthermore, the embodiments may be combined to form additional embodiments.

What is claimed is:

1. A semiconductor device comprising:
- a gate structure including gate lines and insulating layers that are alternately stacked;
- a channel structure extending through the gate structure;
- a dummy gate structure including stacked dummy gate lines;
- a dummy channel structure extending through the dummy gate structure; and
- an isolation insulating structure disposed between the gate structure and the dummy gate structure, wherein the isolation insulating structure includes horizontal portions stacked between the gate structure and the dummy gate structure and vertical portions extending through the horizontal portions.

2. The semiconductor device of claim 1, wherein the horizontal portions are located to correspond to the gate lines and the dummy gate lines.

3. The semiconductor device of claim 2, wherein the insulating layers extend between the horizontal portions and between the dummy gate lines.

4. The semiconductor device of claim 1, wherein the isolation insulating structure comprises:
- an isolation layer including the horizontal portions and the vertical portions; and
- a dummy contact plug located in the isolation layer.

5. The semiconductor device of claim 4, wherein the dummy contact plug is located over the horizontal portions, and the vertical portions extend along sidewalls of the dummy contact plug.

6. The semiconductor device of claim 1, wherein in a memory block, the dummy gate structure and the isolation insulating structure are located in a block edge region, and the gate structure is located in a block center region.

7. The semiconductor device of claim 1, further comprising contact plugs extending through the gate structure and connecting electrically to the gate lines.

8. The semiconductor device of claim 7, further comprising insulating spacers surrounding sidewalls of the contact plugs.

9. The semiconductor device of claim 1, further comprising a chip guard structure, wherein the dummy gate structure is located between the chip guard structure and the isolation insulating structure.

10. The semiconductor device of claim 1, wherein the gate structure extends in a first direction, and the isolation insulating structure extends in a second direction intersecting the first direction.

11. The semiconductor device of claim 10, wherein the isolation insulating structure includes dummy contact structures arranged in the second direction.

12. A semiconductor device comprising:
- a gate structure including stacked gate lines;
- a channel structure extending through the gate structure;
- contact plugs extending through the gate structure and connected to the gate lines, respectively;
- a dummy gate structure adjacent to the gate structure in a first direction and including stacked dummy gate lines;
- a dummy channel structure extending through the dummy gate structure;
- an isolation insulating structure located between the gate structure and the dummy gate structure, extending in a second direction intersecting the first direction; and
- dummy contact plugs arranged in the second direction and disposed in the isolation insulating structure.

13. The semiconductor device of claim 12, wherein the isolation insulating structure includes an isolation layer including horizontal portions located between the gate lines and the dummy gate lines and vertical portions extending through the horizontal portions.

14. The semiconductor device of claim 13, wherein the dummy contact plugs are located on the horizontal portions, and the vertical portions surround sidewalls of the dummy contact plugs.

15. The semiconductor device of claim 12, further comprising a chip guard structure extending through the dummy gate structure.

16. A semiconductor device comprising:
- a gate structure including stacked gate lines;
- a channel structure extending through the gate structure;
- a dummy gate structure including stacked dummy gate lines disposed at levels corresponding to the gate lines;
- a dummy channel structure extending through the dummy gate structure;
- an isolation insulating structure including horizontal portions stacked between the gate structure and the dummy gate structure; and
- insulating layers alternately stacked with the gate lines and extending between the horizontal portions and between the dummy gate lines.

17. The semiconductor device of claim 16, further comprising:

a dummy contact plug disposed between the gate structure and the dummy gate structure, wherein the dummy contact plug is disposed over the horizontal portions.

18. The semiconductor device of claim 17, wherein the isolation insulating structure extends along a sidewall of the dummy contact plug.

19. The semiconductor device of claim 17, further comprising:

contact plugs extending into the gate structure to be connected to the gate lines, respectively.

* * * * *